United States Patent
Takemae et al.

(10) Patent No.: US 6,194,932 B1
(45) Date of Patent: Feb. 27, 2001

(54) INTEGRATED CIRCUIT DEVICE

(75) Inventors: Yoshihiro Takemae; Yasurou Matsuzaki; Hiroyoshi Tomita; Nobutaka Taniguchi, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/383,015

(22) Filed: Aug. 25, 1999

Related U.S. Application Data

(63) Continuation-in-part of application No. 09/037,922, filed on Mar. 10, 1998, now abandoned.

(30) Foreign Application Priority Data

Oct. 20, 1997 (JP) .................................................. 9-287224
Oct. 15, 1998 (JP) ................................................. 10-293545

(51) Int. Cl.[7] .................................................. H03L 7/00
(52) U.S. Cl. .......................... 327/158; 327/141; 327/149; 327/156
(58) Field of Search .................................. 327/141, 156, 327/158, 161, 147, 149, 153

(56) References Cited

U.S. PATENT DOCUMENTS 5,164,677 * 11/1992 Hawkins et al. ..................... 327/158
5,223,755 * 6/1993 Richley ................................ 327/158
5,973,525 * 10/1999 Fujii ..................................... 327/149

FOREIGN PATENT DOCUMENTS 6-350440  12/1994 (JP) .

* cited by examiner

*Primary Examiner*—Dinh T. Le
(74) *Attorney, Agent, or Firm*—Arent Fox Kintner Plotkin & Kahn, PLLC

(57) ABSTRACT

The present invention omits a variable delay circuit (10 in FIG. 1) inside a DLL circuit, and instead, creates a timing synchronization circuit, which generates a second reference clock. The timing synchronization circuit shifts the phase of a first reference clock generated by a frequency divider to the timing of a timing signal generated from the other variable delay circuit so that the second reference clock matches to the timing signal. Then, a phase comparator compares the divided first reference clock to a variable clock that delays the second reference clock, and controls the delay time of the variable delay circuit so that both clocks are in phase. As a result, one variable delay circuit can be omitted, and a DLL circuit that uses a divided clock can be configured.

13 Claims, 19 Drawing Sheets

First Embodiment

First Embodiment

Variable Delay Circuit 2

Delay Controller 9

Second Embodiment

Timing Chart of Second Embodiment

1/2 Phase Shift Circuit

Timing Chart of Third Embodiment

Fourth Embodiment

Operation Timing Chart of Fig. 13

Start Signal Generator

First, Second Frequency Divider

Operation Timing Chart of Frequency Divider

Variable Delay Circuit 2

Fifth Embodiment

INTEGRATED CIRCUIT DEVICE

This application is a continuation-in-part application of U.S. patent application Ser. No. 09/037,922, filed on Mar. 10, 1998, which is now abandoned.

BACKGROUND OF THE INVENTION

1. Field of the Invention

The present invention relates to an improved delayed lock loop (DLL), which generates a timing signal to internal circuitry that operates at a fixed phase timing relative to an external clock, and to an integrated circuit device, which comprises a DLL circuit, the scale of the circuitry of which can be reduced by omitting a variable delay circuit. The present invention also relates to an integrated circuit device in which a variable delay circuit has been eliminated to make the circuit smaller, and in which the timing signal phases can be more precisely controlled.

2. Description of the Related Art

Recent memory devices are required to operate at speeds in excess of 100 MHz. To achieve this a DLL circuit is fabricated internally, the phase of an external clock is matched up with that of a data output signal, and internal wiring does away with delay characteristic effects, thus holding down access time delays and variations. The system side, which controls the memory device, supplies the memory device with a clock, applies data and addresses in synch with the clock, and accepts output data in synch with the clock.

This applicant proposed a DLL circuit such as this in Application No. 8-339988 dated Dec. 19, 1996. FIG. 1 depicts an example of a timing signal generator, which uses this DLL circuit.

FIG. 1 depicts an input buffer 1, to which an external clock CLK is input, and which generates an internal clock N1; a variable delay circuit 2, which delays this internal clock N1 for a predetermined interval of time, and generates a timing signal N4; a frequency divider 4, which generates a first reference clock N2 by dividing the interval clock N1 by 1/N; a variable delay circuit 10, which delays the first reference clock N2; a variable clock N7, which is propagated via a dummy data output buffer 6 and a dummy input buffer 7; a phase comparator 8, which carries out phase comparison on the first reference clock N2 divided by the frequency divider 4; and a delay controller 9, which is responsive to a detection signal N8 of the phase comparator 8, and which generates a delay control signal N9, which controls the delay time of the above-described variable delay circuits 2, 10. A data output buffer 3, which is an internal circuit, outputs read data from memory DATA as data output DQ in response to the timing signal N4.

The DLL circuit comprises a variable delay circuit 10, dummy circuits 6, 7, phase comparator 8 and delay controller 9. Then, the delay time of the variable delay circuit 10 is controlled by the phase comparator 8 and delay controller 9 so that the first reference clock N2 is in phase with the variable clock N7. As a result, the phase of the external clock CLK matches up with that of the output N6 of the dummy data output buffer 6. Then, because the delay time of the variable delay circuit 2 is also controlled by the same delay control signal N9, the data output DQ outputted in response to the timing signal N4 is synchronized with the phase of the external clock CLK.

The frequency divider 4 shown in FIG. 1 is provided to prevent an increase in power consumption due to the increasing difficulty in conducting phase comparison in a phase comparator 8 as the frequency of the clock CLK increases. The frequency of the clock CLK is lowered to generate a low-frequency standard clock N2, and this standard clock N2 is used in the feed back loop of the DLL circuit to conduct phase comparison for the low-speed clock. Further, unlike the data output DQ, the output N6 from a dummy data output buffer 6 is not connected to an external terminal resistance, so the output N6 amplitude is matched to the internal power supply of the integrated circuit so as to be large amplitude level. Thus, when a high-frequency internal clock N1 is supplied, a full swing is not possible for the output waveform N6 in accordance with a rectangular wave clock N1, resulting in a triangular wave and in unstable delay characteristics. For this reason, the frequency divided clock N2 is used in the DLL circuit feedback loop.

When entering data, addresses, or commands, the above mentioned timing signal N4 is supplied to the respective input buffers instead of the above mentioned data output buffer 3.

However, a plurality of data output DQ is created in a memory device, requiring that a plurality of sets of the circuits depicted in FIG. 1 be fabricated in line with this. The input buffer 1 and 1/N frequency divider 4 can be integrated into a common circuit, but two of the variable delay circuits, with their large-scale circuit architectures, must be fabricated for each set of circuits, which means the circuitry depicted in FIG. 1 would run contrary to the high degree of integration required of a memory device.

Further, in the DLL circuit in FIG. 1, the clocks N1 and N2, which have different frequencies, are supplied to the two variable delay circuits 2 and 10 respectively, so the variable delay circuits 2 and 10 have different delay times, even when controlled by the same delay control signal N9. In other words, the high-speed clock N1 is supplied to the variable delay circuit 2, the power supply voltage drops due to the application of high frequency, and the operating speed of the gate forming the variable delay circuit 2 slows down, prolonging the delay time of the variable delay circuit. By contrast, the divided low-frequency clock N2 is supplied to the variable delay circuit 10, resulting in less of a drop in the power supply voltage and in less of a delay in the operating speed of the gate forming the variable delay circuit 10. The delay time of the variable delay circuit 10 accordingly tends to be shorter than the delay time of the variable delay circuit 2. This difference in delay time causes the timing signal N4 phase to be delayed, so that the data output DQ phase does not always match the external clock CLK phase.

SUMMARY OF THE INVENTION

Accordingly, an object of the present invention is to provide an integrated circuit device (IC), which further simplifies a timing signal generator that utilizes a DLL circuit.

Furthermore, another object of the present invention is to provide a simplified IC by omitting a variable delay circuit from a timing signal generator that utilizes a DLL circuit.

An object of the present invention is to provide an integrated circuit device involving a simpler timing signal generation circuit using a DLL circuit, as well as more precise control of its phases.

Another object of the present invention is to provide an integrated circuit device in which a variable delay circuit has been eliminated to simplify the circuit that generates a timing signal using a DLL circuit, and to more precisely control its phases.

To achieve the above-cited objects, the first aspect of the present invention omits a variable delay circuit (10 in FIG. 1) inside a DLL circuit, and instead, creates a timing synchronization circuit, which generates a second reference clock. The timing synchronization circuit shifts the phase of a first reference clock generated by a frequency divider to the timing of a timing signal generated from the other variable delay circuit so that the second reference clock matches to the timing signal. Then, a phase comparator compares the divided first reference clock to a variable clock that delays the second reference clock, and controls the delay time of the variable delay circuit so that both clocks are in phase. As a result, one variable delay circuit can be omitted, and a DLL circuit that uses a divided clock can be configured.

To achieve the above-described objects, the present invention is an integrated circuit device, which comprises an internal circuitry that operates at a predetermined phase related to a supplied clock, the integrated circuit device comprising: a variable delay circuit, which generates a timing signal to the internal circuitry by delaying the supplied clock a predetermined time; a frequency divider, which generates a first reference clock by dividing the frequency of the supplied clock; a timing synchronization circuit, which generates a second reference clock by synchronizing the first reference clock to the timing of the timing signal; and a phase comparator and controller, which compares the phase of the first reference clock to that of a variable clock, which delays the second reference clock a predetermined time, and supplies a delay control signal to the variable delay circuit so as to phase match the variable clock with the first reference clock.

In accordance with the above-described configuration, a variable delay circuit (10 in FIG. 1) can be omitted from the circuit architecture of the above-described prior application, enabling compliance with high integration requirements.

The above-described invention according to more preferred embodiment is further characterized in that the supplied first reference clock comprises the pulse width of one cycle of the supplied clock, the second reference clock comprises the inverted level of the first reference clock, and the phase comparator and controller controls the delay time of the variable delay circuit so that the phase of the rising or falling edge of the first reference clock matches the phase of the rising or falling edge of the variable clock.

In accordance with the above-described invention, it is possible to synchronize the timing of the operation of the internal circuitry to the timing following one cycle of a supplied external clock.

The above-described invention according to more preferred embodiment is further characterized in that the frequency divider is integrated into a common circuit, and a plurality of sets of the variable delay circuit, timing synchronization circuit and phase comparator and controller are fabricated. Therefore, even if a plurality of sets of DLL circuits are fabricated corresponding to when a plurality of data output terminals are fabricated, this does not impede large-scale integration.

To achieve the above stated object, the second aspect of the present invention eliminates a variable delay circuit in the feed back loop of the DLL circuit, and instead divides the frequency of a real clock to generate a first standard clock while also generating a second standard clock by dividing the frequency of the timing signal generated by a variable delay circuit through which the real clock passes. A phase comparator then makes a comparison between the frequency-divided first standard clock and the variable clock resulting from the delay of the second standard clock, and the amount of delay of the variable delay circuit is controlled so that the phases of both clocks match. This makes it possible to reduce the number of variable delay circuits to one and to form a DLL circuit using a frequency-divided clock. The amount of the delay of the jointly used variable delay circuit is controlled by the delay control signal, and a frequency-divided clock used for the feedback from the delayed clock is generated, which makes it possible to match the amount of delay in the DLL feedback loop with the amount of delay in the circuit that generates the timing signal, and to precisely control the timing signal phase.

To achieve the above stated purpose, the second aspect of the present invention is an integrated circuit device having an internal circuit that is activated at a timing signal having a specified phase relationship with a clock, comprising: a variable delay circuit for delaying the clock for a specified time and generating said timing signal for the internal circuit; a first frequency divider for dividing a clock frequency and generating a first reference clock; a second frequency divider for dividing the frequency of the timing signal and generating a second reference clock; and a phase comparison and control circuit for comparing a phase of a variable clock resulting from the second reference clock and the phase of the first reference clock, and for applying a delay control signal to the variable delay circuit so that the phases of both the first reference clock and the variable clock match.

The above arrangement makes it possible to eliminate the variable delay circuit in the feed back loop from a conventional circuit configuration and to meet the demand for higher integration. Further, the above arrangement also makes it possible to precisely control the timing signal phase.

More preferred embodiment of the present invention is the integrated circuit wherein the first frequency divider is provided for joint use, and a plurality of sets of the variable delay circuit, second frequency divider, and phase comparison and control circuit are provided according to the internal circuit. Higher integration can thus still be achieved even when a plurality of DLL circuits are provided in cases where a plurality of data output terminals or signal input terminals are provided.

DESCRIPTION OF THE PREFERRED EMBODIMENTS

Embodiments of the present invention are described below in accordance with the figures. However, the technological scope of the present invention is in no way limited to these embodiments.

Figure 1:
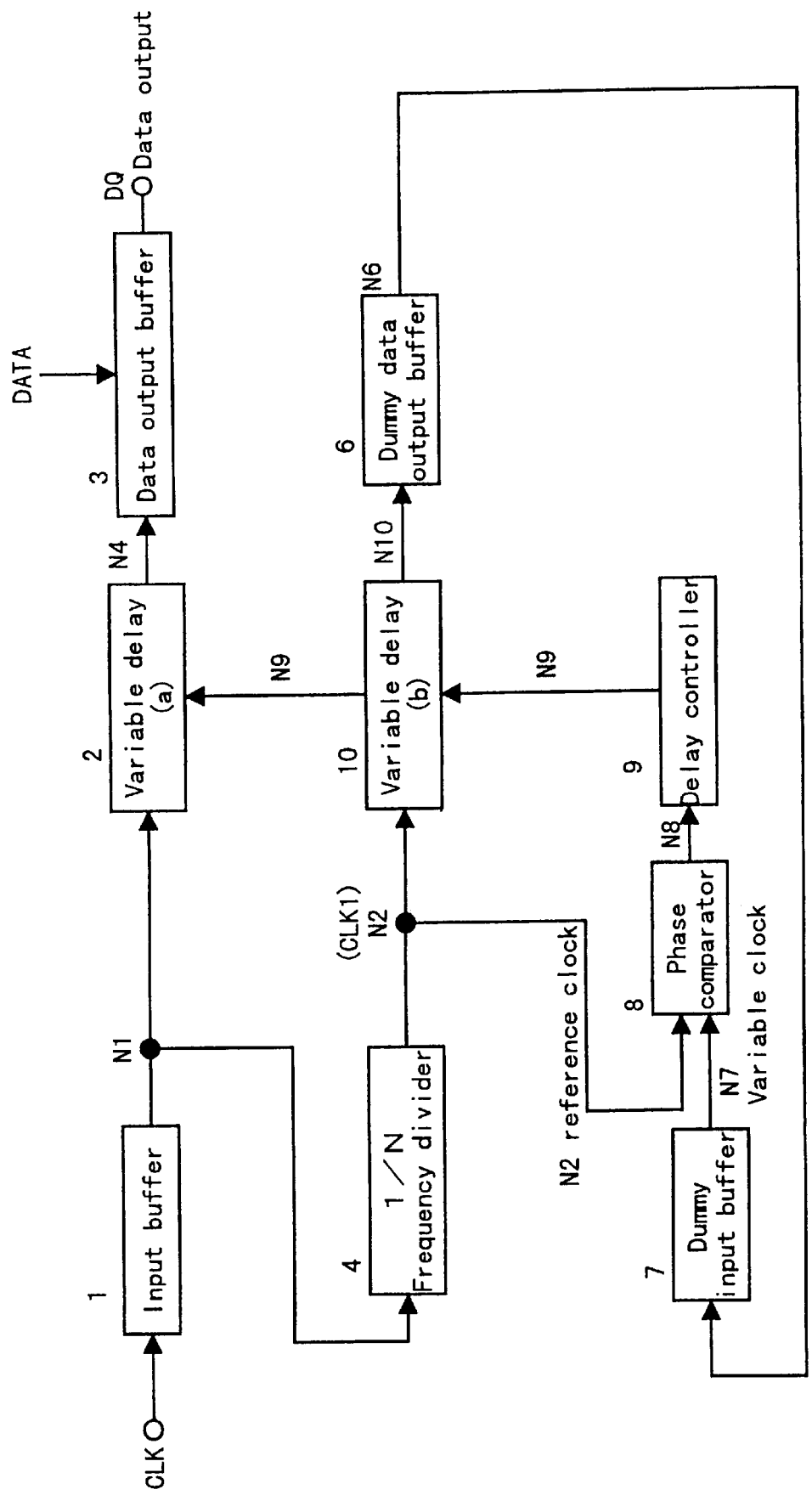
FIG. 1 depicts an example of a timing signal generator, which uses this DLL circuit.
Figure 2:
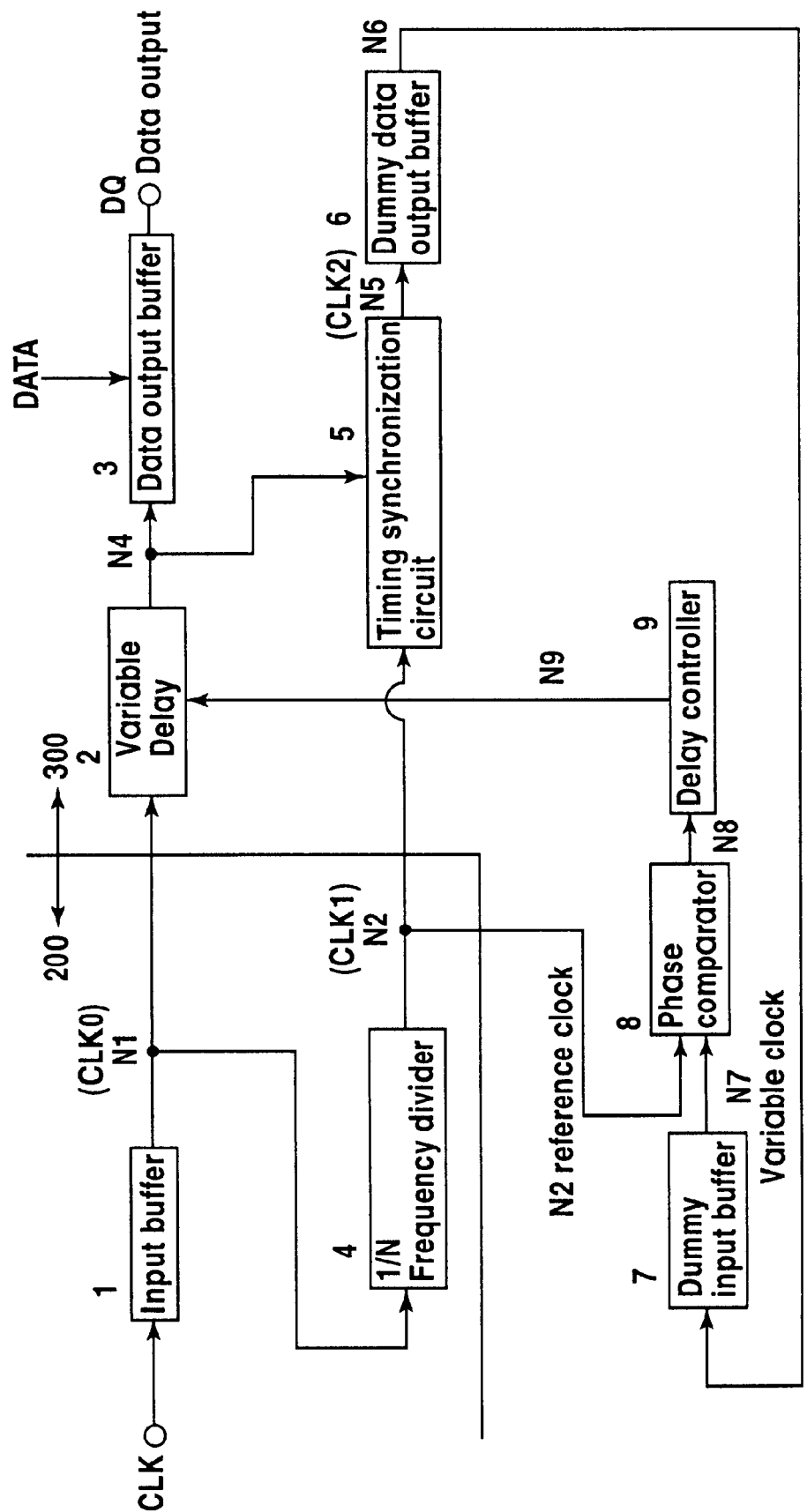
FIG. 2 depicts a first embodiment of the present invention.

FIG. 2 depicts a first embodiment of the present invention. The same reference numbers are given to parts in FIG. 2 which correspond to parts in FIG. 1. The variable delay circuit 10 depicted in FIG. 1 is omitted from FIG. 2, and in its place, a timing synchronization circuit 5 is provided.

An external clock CLK is supplied to an input buffer 1, and the input buffer 1 detects the external clock and generates an internal clock N1. A variable delay circuit 2 delays the internal clock N1 a predetermined time interval, and then generates a timing signal N4. A data output buffer 3 is responsive to this timing signal N4, outputting data from memory DATA as data output DQ.

As for the internal clock N1, a 1/N frequency divider 4 divides the frequency of that clock N1 into 1/N, and generates a first reference clock N2. This first reference clock N2 is supplied to a phase comparator 8. Also, a timing synchronization circuit 5 synchronizes the first reference clock N2 with the timing of timing signal N4, and generates a second reference clock N5. This embodiment makes the variable delay circuit 2 serve as a variable delay circuit within a DLL circuit, matches the divided first reference clock N2 to this circuit's delayed timing, and supplies the second reference clock N5 to dummy circuits 6, 7. As a result, a variable clock N7 outputted from the dummy input buffer 7 is a frequency divided clock, and possesses the delay time of the variable delay circuit 2 and the delay time of the dummy circuits 6, 7.

Figure 3:
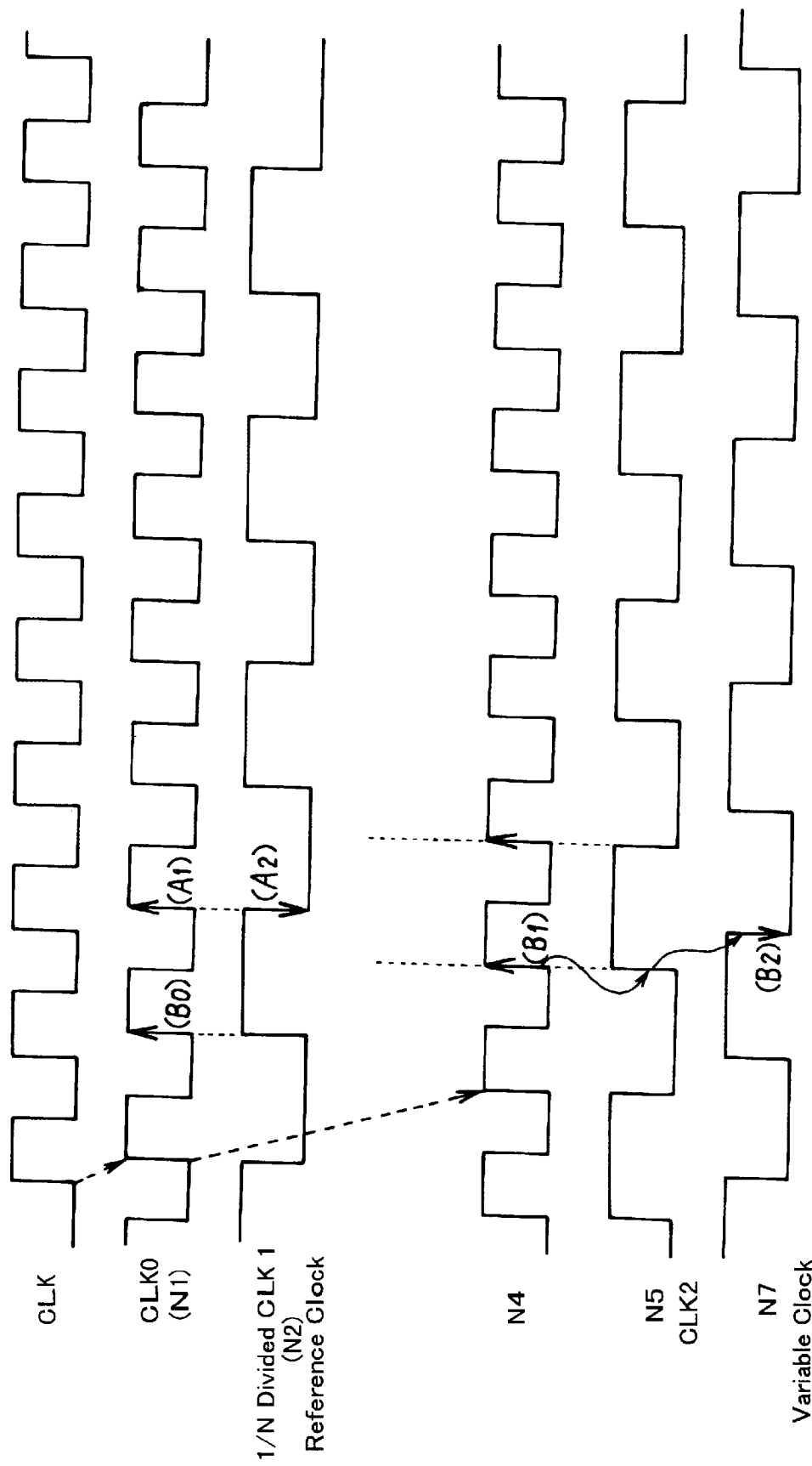
FIG. 3 depicts a timing chart showing the operation of the first embodiment depicted in FIG. 2.

FIG. 3 depicts a timing chart showing the operation of the first embodiment depicted in FIG. 2. As described above, the external clock CLK generates an internal clock N1 (CLK0), which possesses a fixed delay resulting from the input buffer 1. Also in the example depicted in FIG. 3, the frequency divider 4 divides the internal clock N1 (CLK0) in half, and generates a first reference clock N2(CLK1). The phases of the first reference clock N2 and the internal clock N1 are approximately matched.

Accordingly, the variable delay circuit 2 delays the internal clock N1 a predetermined delay time, and generates a timing signal N4. In the figure, the rising edge B0 of the internal clock N1 is delayed to the rising edge B1 of the timing signal N4. Then, the timing synchronization circuit 5 generates a second reference clock N5 (CLK2), by shifting and matching the divided first reference clock N2 (CLK1) to the timing of the timing signal N4. As is described below, this timing synchronization circuit 5 comprises, for example, a D-type flip-flop, which inputs the first reference clock N2 (CLK1) to a D input terminal, inputs the timing signal N4 to a clock terminal, and generates the second reference clock N5 to an output terminal. As a result, as depicted in FIG. 3, the second reference clock N5 delays the divided first reference clock N2 only the delay time of the variable delay circuit 2.

This second reference clock N5 is supplied via the dummy data output buffer 6 and dummy input buffer 7 to the phase comparator 8 as a variable clock N7. In the example depicted in FIG. 3, the variable clock N7 delays the second reference clock N5 by the delay time of the dummy circuits 6, 7, and is inverted. Therefore, the edge B2, which corresponds to the rising edge B0 of the internal clock N1, becomes the falling edge in the variable clock N7.

The fact that the above-described variable clock N7 is an inverted clock is not essential. However, by utilizing an inverted clock, it is possible to exert control so that the first reference clock (N2) falling edge A2, which is synchronized with the rising edge A1 of the internal clock N1 one cycle after the rising edge B0 of the internal clock N1, is phase matched with the falling edge B2 of the variable clock N7, which corresponds to rising edge A1. When there is no inverted clock, the phase of the falling edge A2 of the first reference clock N2 can be compared to the phase of the falling edge B2 of the variable clock N7 in the phase comparator 8. The rising edges of the first reference clock N2 and variable clock N7 may also be phase compared.

Also, since the frequency divider depicted in FIG. 3 is a ½ divider, the falling edge A2 can be matched to the phase of the one cycle delay of the internal clock N1.

As described above, the first embodiment enables the omission of one variable delay circuit, and since the timing synchronization circuit 5 fabricated in its place is much smaller in size, it is possible to meet requirements for a high degree of integration particularly when creating a plurality of sets of DLL circuits. That is, part of the circuitry 200 depicted in FIG. 2 is integrated commonly, and part of the circuitry 300 is fabricated for each data output DQ, but part of the circuitry 300 is simplified.

Next, detailed circuit examples are given for the variable delay circuit 2, the delay controller 9 and the phase comparator 8 comprising the circuit depicted in FIG. 2.

Figure 4:
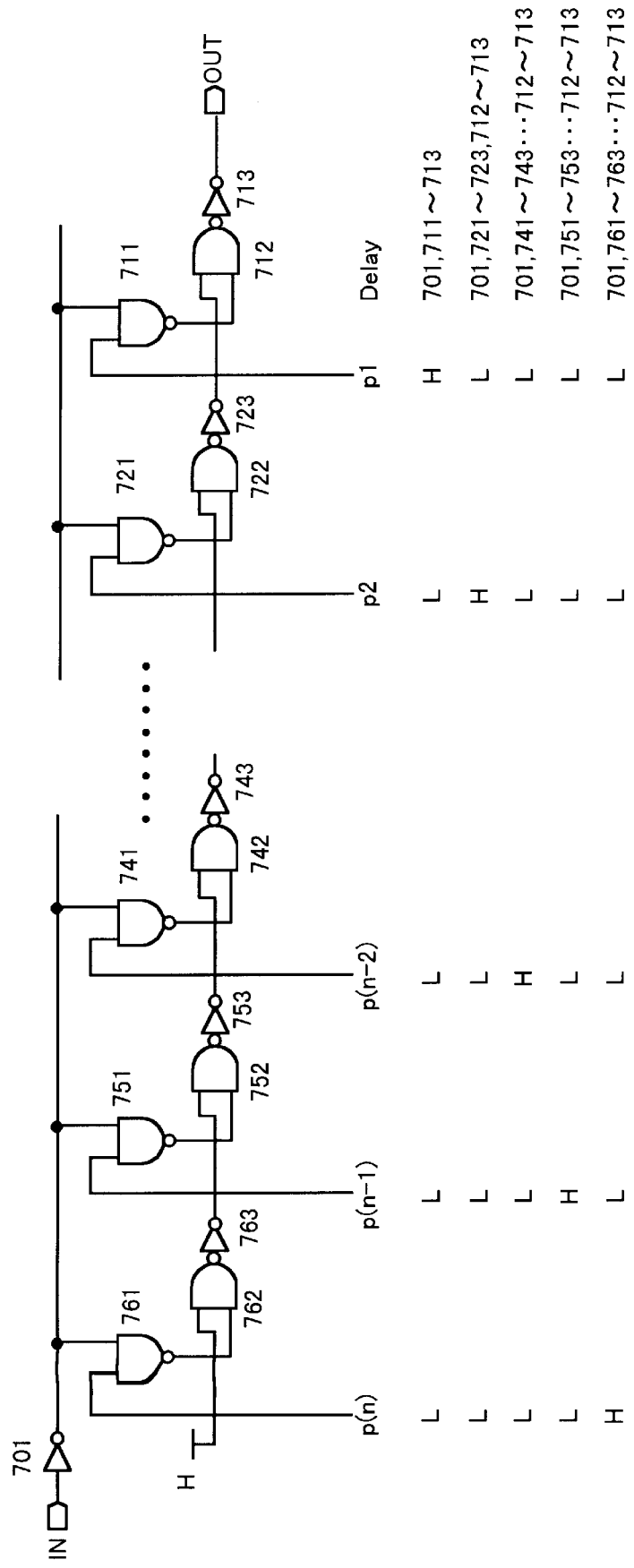
FIG. 4 is a circuit diagram depicting an example of a variable delay circuit.

FIG. 4 is a circuit diagram depicting an example of a variable delay circuit. The delay time of this circuit is selected by delay control signals p1–p(n) (N9 in FIG. 2). This variable delay circuit delays a clock applied to an input terminal IN for a predetermined interval, and then outputs it to an output terminal OUT. This example depicts an n-stage delay circuit, in which the first stage comprises NAND gates 711, 712 and inverter 713, the second stage comprises NAND gates 721, 722 and inverter 723, and so forth down to the nth stage, which comprises NAND gates 761, 762 and inverter 763.

One of the delay control signals p1–p(n)(N9) can be H level, and the others are all L level. Then, only the one NAND gate 711, 721, . . . 761 which corresponds to the H level delay control signal p is opened, and the clock applied to input IN is allowed to propagate through that gate. All the other NAND gates 711, 721, . . . 761 corresponding to the other L level delay control signals p remain closed. As diagrammed in the figure, when delay control signal p1 is H level, NAND gate 711 opens, forming a delay path from the input terminal IN via inverter 701, NAND gates 711, 712 and inverter 713 to the output terminal OUT. Therefore, the delay path comprises a four gate delay.

When delay control signal p2 is H level, NAND gate 721 opens. Because the input of gate 762 is at H level as well, the output of inverter 763 is H level, and similarly the outputs of inverters 753, 743 . . . are also H level. Therefore, NAND gate 722 is also in the open state. As a result, a delay path is formed from the input terminal IN via inverter 701, gates 721–723, 712, 713 to the output terminal OUT. Therefore, the delay path comprises a six gate delay.

Hereafter, as depicted in FIG. 4, each time the H level delay control signal moves to the left, the number of gates in the delay path increases by two. This is the cause of variable delay circuit jitter. When delay control signal p(n) is H level, the number of gates in the delay path becomes 2+2n.

Figure 5:
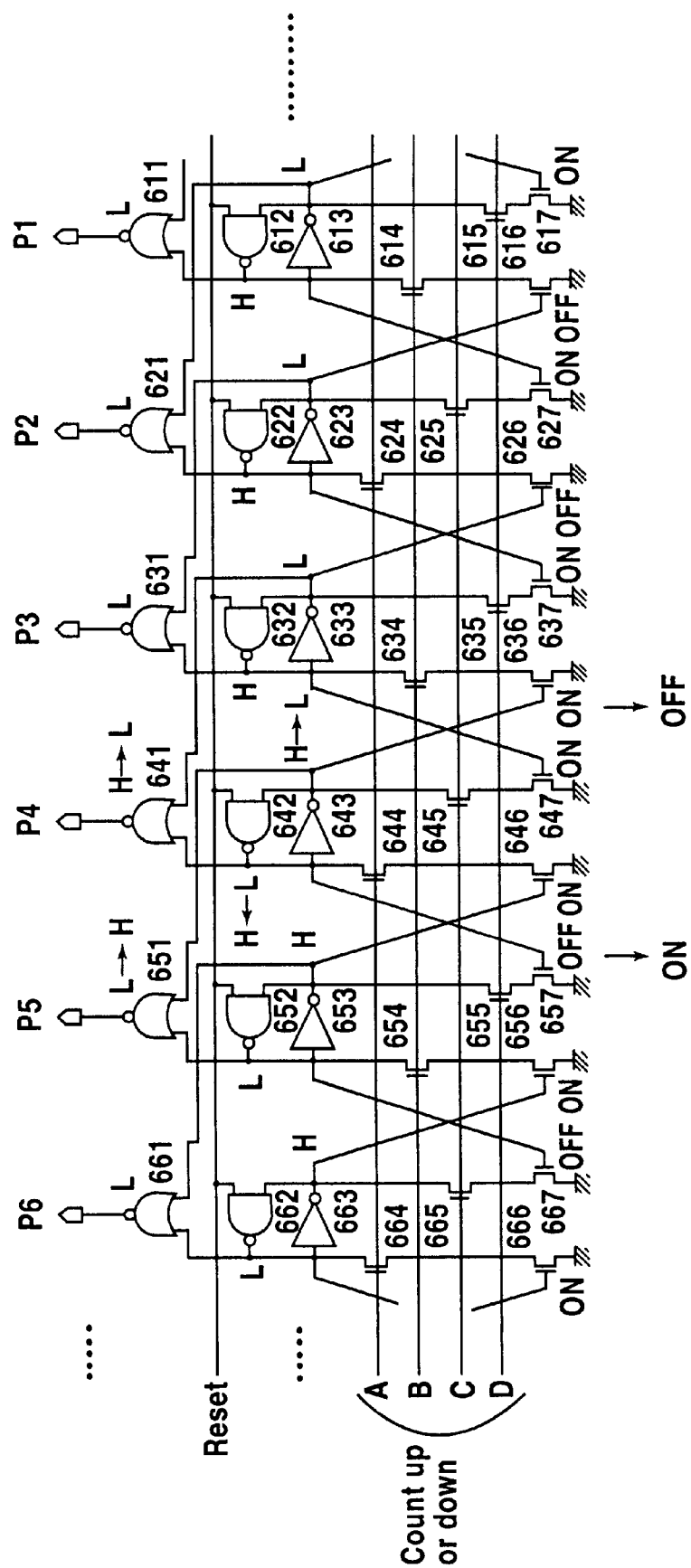
FIG. 5 is a diagram of a delay controller.

FIG. 5 is a diagram of a delay controller 9. FIG. 5 depicts a portion of a delay controller 9, and by way of explanation, depict s the delay control signals p1–p6 (N9) of the variable delay circuit. Detection signals A–D (N8 in FIG. 2), which are phase comparison results from the phase comparator, are applied to this delay controller. Detection signals A, B shift the H level delay control signal p to the right, while detection signals C, D shift the H level delay control signal p to the left.

Each stage of the delay controller comprises a latch, as in stage one, for example, where this latch comprises NAND gate 612 and inverter 613. The first stage also comprises transistors 614, 615, which forcibly reverse the state of latch 612, 613 in accordance with detection signals A–D. Transistors 616, 617 are fabricated to ensure that the latch is not reversed by transistors 614, 615 when it is not targeted for reversal. The second through the sixth stages of the circuit feature the same architecture. All of these transistors are N-channel type.

Now, hypothetically, assume that the output p4 of the fourth stage is in the H level state. All other output is in the L level state. The state of each stage latch is as depicted in FIG. 5 by H, L. That is, whereas NAND output is H level and inverter output is L level for stage one through stage three latches, from stage four through stage six, the NAND output is L level and the inverter output is H level for the latches. Therefore, transistors connected to grounds 617, 627, 637, 647, 646, 656, 666 are all in a conductive state. That is, third stage transistor 636 and fourth stage transistor 647, which fall on each side of the latch state boundary, are in a conductive state, creating a state wherein it is possible for the state of those latches to be reversed by detection signal B or C.

At this point, if, hypothetically, an H level is applied by detection signal C, transistor 645 will conduct, and the output of inverter 643 will be forcibly driven from H level to L level. Consequently, the output of NAND gate 642 also transitions from L level to H level, and is latched in that state. The transition of NAND gate 642 output to H level causes the output p4 of NOR gate 641 to transition to L level, and the output p5 of NOR gate 651 transitions to H level in accordance with the transition to L level of inverter 643 output. As a result, the H level delay control signal shifts from p4 to p5. As illustrated in FIG. 4, as the H level delay control signal p shifts to the left, the delay path of the variable delay circuit is controlled so that it lengthens and the delay time increases.

Conversely, if, hypothetically, an H level is applied by detection signal B, via the same operation as described above, the output of NAND gate 632 in the third stage latch is forcibly switched to L level, and inverter 633 output transitions to H level. As a result, output p3 becomes H level.

This controls the delay path of the variable delay circuit so that it shortens and the delay time decreases.

Furthermore, if output p5 or p3 becomes H level, this time the H level output is controlled to be shifted to the right or to the left, respectively, by detection signal A or D. That is, detection signals A, B control shift H level output to the right, and detection signals C, D control shift H level output to the left. Further, detection signals A, D control shift H level output when odd number outputs p1, p3, p5 are in the H level state, and detection signals B, C control shift H level output when even number outputs p2, p4, p6 are in the H level.

Moreover, when this delay controller 9 commences operation, a reset signal Reset causes delay control signal p1 to H level, setting the delay time of variable delay circuit 2 to the minimum state. Therefore, the delay time of the feedback loop in the DLL circuit commences operation from the minimum time, and is controlled so that timing B2 matches timing A1, A2 after one cycle.

Figure 6:
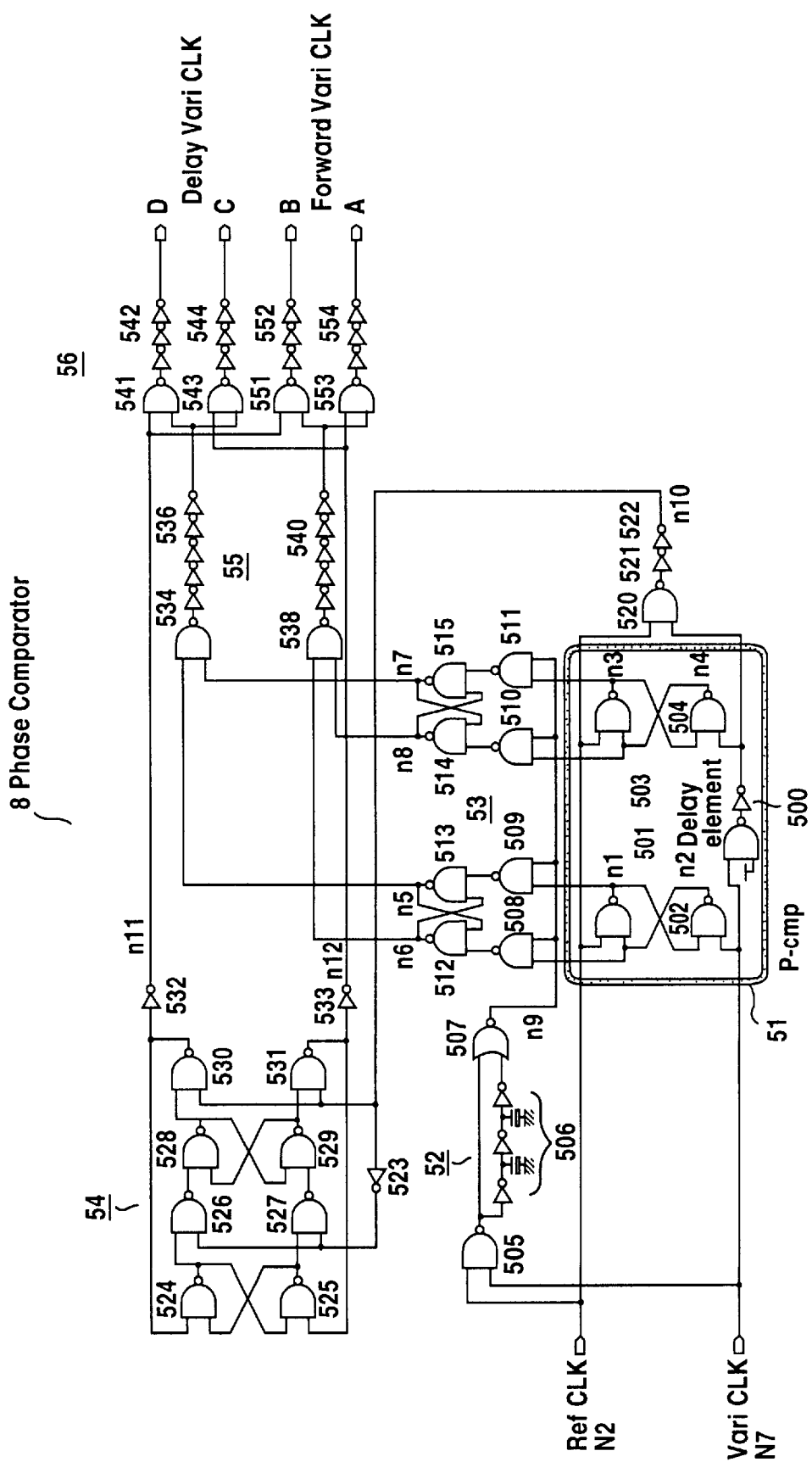
FIG. 6 depicts a circuit diagram of a phase comparator.

FIG. 6 depicts a circuit diagram of a phase comparator 8. This phase comparator comprises a phase detector 51, which detects the clock phase relationship between a variable clock VariCLK and a reference clock RefCLK. This phase detector 51 comprises two latches, comprising NAND gates 501, 502 and 503, 504, and it detects when the phase of the variable clock VariCLK relative to the reference clock RefCLK is (1) faster than a fixed time, (2) relates to a phase difference that is more or less within a fixed time, and (3) is slower than a fixed time. The three states described above are detected by combining detection outputs n1–n4.

A sampling pulse generator 52, comprising NAND gate 505, delay circuit 506 and NOR gate 507 outputs to a node n9 a sampling signal when the two clocks, the RefCLK and the VariCLK, are both H level. A sampling latch element 53 uses the sampling signal n9 to sample detection outputs n1–n4 via sampling gates 508–511, and latches them to latches comprising NAND gates 512, 513 and 514, 515.

Therefore, detection outputs n1–n4 are latched at sampling time to nodes n5–n8, respectively.

A ½ frequency divider 54 having a JK flip-flop receives a detection pulse n10 when NAND gate S20 detects both clocks, the VariCLK and the RefCLK, are H level, divides that detected pulse n10 in half, and generates antiphase pulse signals n11 and n12. A decoder 55 decodes signals from nodes n5–n8, which were sampling latched, and when the variable clock VariCLK is faster than the reference clock RefCLK, sets the output of diode 536 to H level; when both clocks are phase matched, sets the outputs of both diodes 536 and 540 to L level; and when the variable clock VariCLK is slower than the reference clock RefCLK, sets the output of diode 540 to H level. An output circuit 56 is responsive to antiphase pulse signals n11 and n12, and outputs detection signals A–D in accordance with the output of the decoder 55. As already explained, the detection signals A–D control the state of the delay controller.

Figure 7:
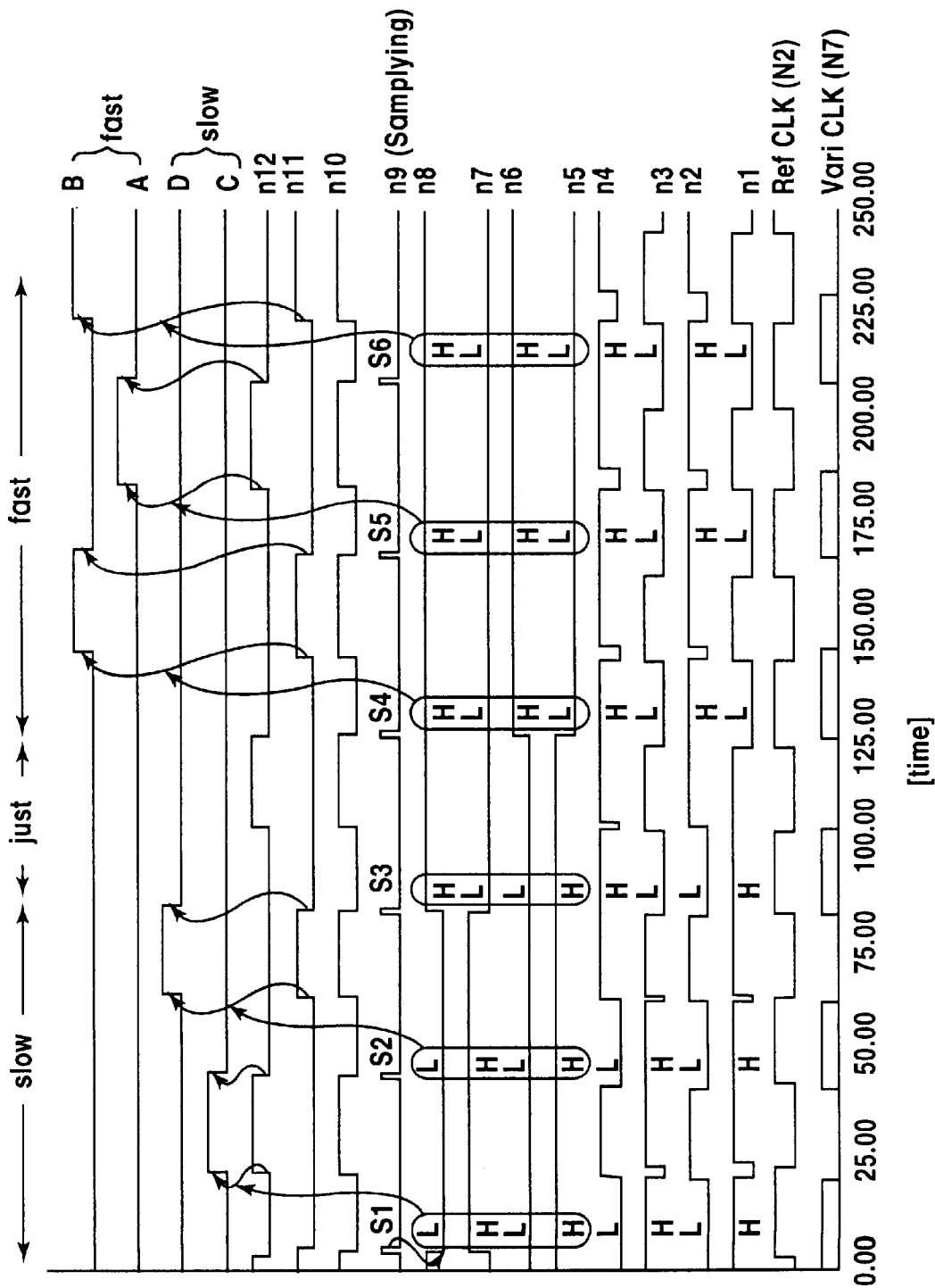
FIG. 7 is a timing chart depicting the operations [of the circuits depicted] in FIG. 6.

FIG. 7 is a timing chart depicting the operations of the circuits depicted in FIG. 6. This figure depicts the state in which the variable clock VariCLK is faster than the reference clock RefCLK, the state in which both clocks are phase matched, and the state in which the variable clock VariCLK is slower than the reference clock RefCLK, in that order. That is, when the sampling pulse n9 is S1, S2, since the variable clock VariCLK is faster, this is detected, and in response to pulse n12, detection signal C is output at H level, and in response to pulse n11, detection signal D is output at H level. When the sampling pulse is S3, there is phase matching, and detection signals A–D are all L level. Furthermore, when the sampling pulse is S4, S5, S6, since the variable clock VariCLK is slower, this is detected, and, in response to pulse n11 and n12, detection signal B and detection signal A, respectively, are output at H level.

The above-described operations are explained in order below.

Sampling Pulse S1

Since the variable clock VariCLK is faster during this period, from a state where both clocks, the variable clock VariCLK and the reference clock RefCLK, are in the L level state, the variable clock VariCLK transitions to H level first, and node n2 is latched at L level and node n1 is latched at H level. A NAND and inverter 500 are a delay element, which delays the variable clock VariCLK a fixed time, and similarly, in NAND 503, 504 as well, node n3 is latched at H level and node n4 is latched at H level. Accordingly, at the timing when both clocks VariCLK, RefCLK are H level, the sampling generator 52 generates a sampling pulse n9 with the width of the delay time of the delay circuit 506, the latch state in the phase comparator 51 is sampled, and that latch state is latched by the latch 53. That is, the state of nodes n1–n4 is transferred to nodes n5–n8.

Then, pulse n10 is generated at the timing when both clocks VariCLK, RefCLK are H level. As for the frequency divider 54, a latch of NAND circuits 524, 525, and a latch of NAND circuits 528, 529 are connected to NAND gates 526, 527 and NAND gates 530, 531, respectively. These gates are opened by inverted, non-inverted pulses of pulse n10. Therefore, pulse n10 is divided in half.

In the decoder 55, the H, L, H, L level states of nodes n5–n8 cause the output of inverter 536 to become H level, and the output of inverter 540 to become L level. Therefore, in response to pulse n12, the H level of inverter 536 propagates via NAND gate 543 and inverter 544 to set detection signal C at H level. The H level of detection signal C shifts to the left the H level output of the shift register, lengthening the delay path of the variable delay circuit. As a result, the variable clock VariCLK is controlled in the direction in which it is delayed.

Sampling Pulse S2

Similar to the above, the fact that the variable clock VariCLK is faster is detected by the phase comparator 51, and in response to pulse n11, detection signal D becomes H level. Therefore, similarly, the H level output of the signal D, which is the delay control signal P of the delay control circuit, shifts to the left, and the delay path of the variable delay circuit lengthens.

Sampling Pulse S3

At the timing at which sampling pulse S3 is outputted, both clocks, VariCLK and RefCLK, are nearly phase matched. When there is a phase shift within the delay time of the delay element 505, and the variable clock VariCLK is slightly fast, the following occurs:

n1=H, n2=L, n3=L, n4=H
n5=H, n6=L, n7=L, n8=H

This state is depicted in FIG. 7. When there is a phase shift within the delay time of the delay element 505, and the variable clock VariCLK is slightly slow, the following occurs:

n1=L, n2=H, n3=H, n4=L
n5=L, n6=H, n7=H, n8=L

In either case, these states are decoded by the decoder 55, and the output of both inverters 536, 540 become L level, and detection outputs A–D all become L level. As a result, the state of the delay control circuit remains the same, and there is no change in the delay time of the variable delay circuit.

Sampling Pulses S4, S5, S6

When this happens, the variable clock VariCLK is slow. Therefore, the latch states of the phase comparator 51 are:

n1=L, n2=H, n3=L, n4=H and as a result, the sampled latch 53 also becomes:

n5=L, n6=H, n7=L, n8=H

This state is decoded by the decoder 55, making the output of inverter 536 L level, and the output of inverter 540 H level. Therefore, in response to pulses n11 and n12, detection signals B and A, respectively, become H level. As a result, the delay control signal p of the delay control circuit shifts to the right, thereby shortening the delay path of the variable delay circuit, and decreasing the delay time. Consequently, the variable clock VariCLK is controlled in the direction in which it speeds up.

Second Embodiment

Figure 8:
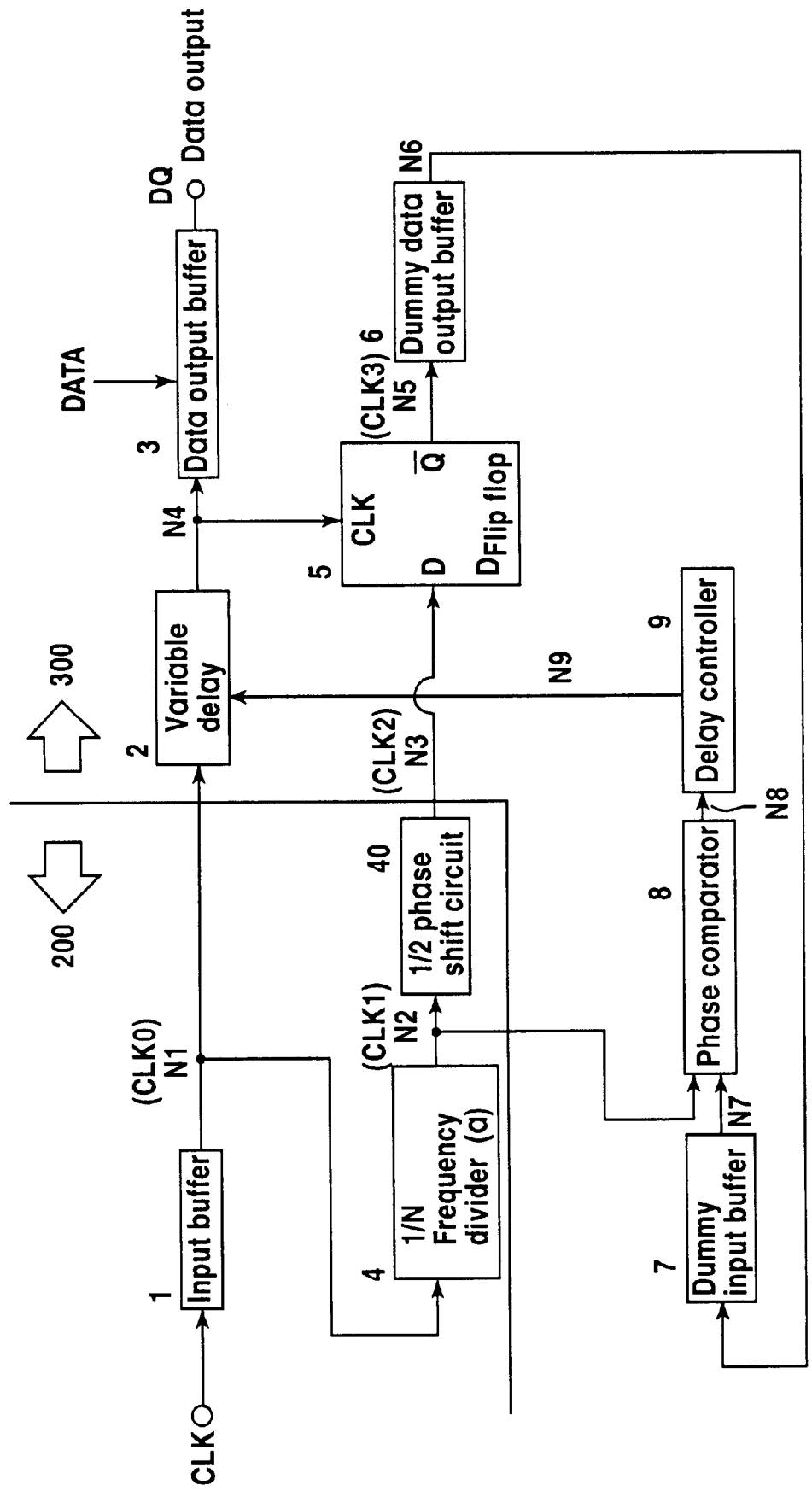
FIG. 8 depicts a circuit diagram of the second embodiment.
Figure 9:
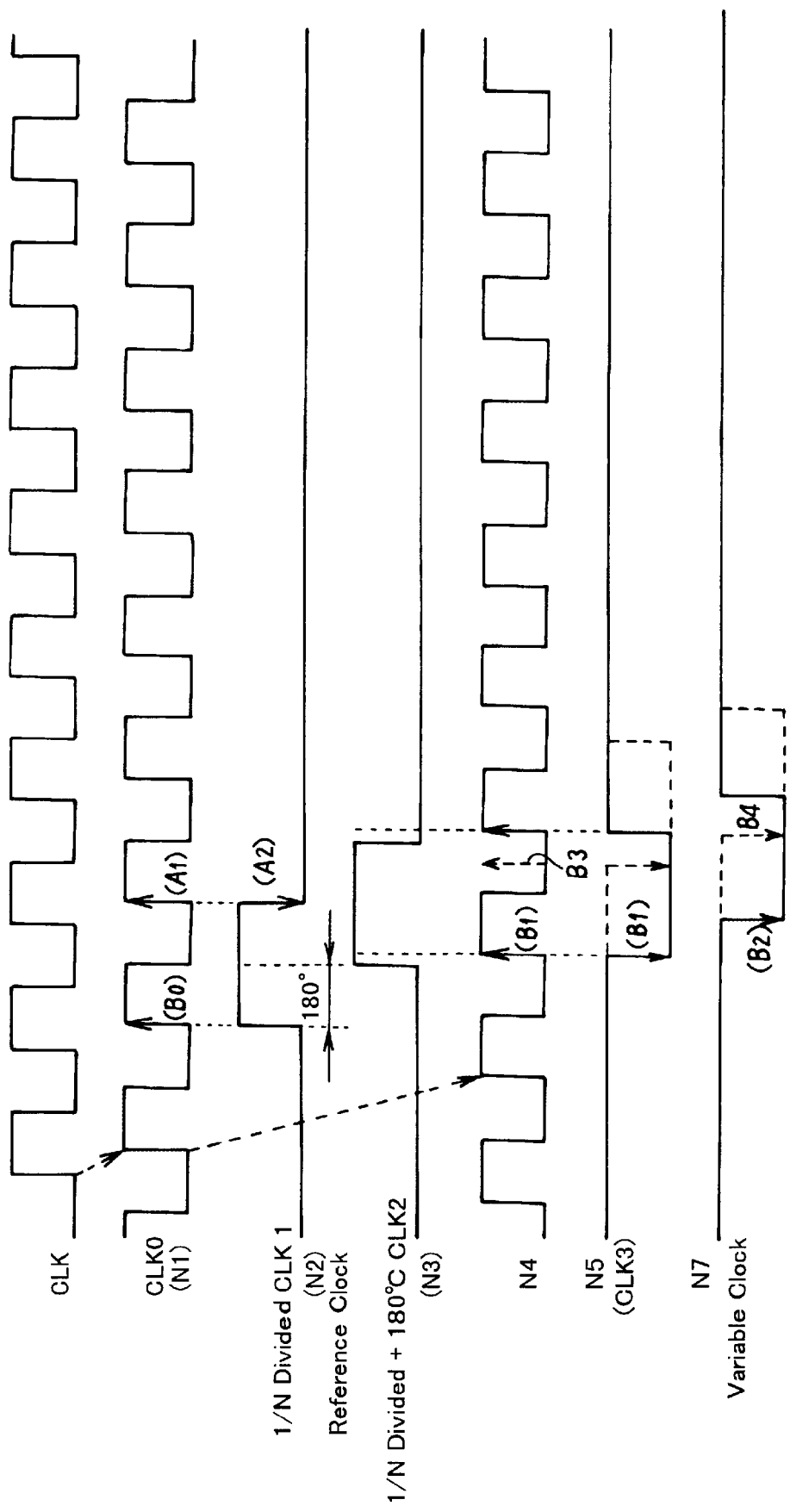
FIG. 9 is an operational timing chart for the circuitry depicted in FIG. 8.

FIG. 8 depicts a circuit diagram of the second embodiment. And FIG. 9 is an operational timing chart for the circuitry depicted in FIG. 8. Identical to the first embodiment, the second embodiment also omits a variable delay circuit within the DLL circuit, and generates a divided clock for the feedback loop using the delay time of a variable delay circuit 2, which generates a timing signal N4.

In the second embodiment, the 1/N frequency divider 4 divides the interval clock N1 into an internal clock N2 whose the pulse width is one cycle of the internal clock N1, by using a higher frequency division ratio than ½. This enables the phase comparator 8 to carry out phase comparison operations with more leeway. Therefore, as depicted in FIG. 9, the divided first reference clock N2 is generated, which rises on the rising edge B0 of internal clock N1, and falls at the next rising edge A1. Therefore, the phase of this falling edge A2 is used in the phase comparator 8.

Then, a ½ phase shift circuit 40 shifts the phase of the first reference clock N2 (CLK1) 180 degrees, and generates a second reference clock N3 (CLK2). This second reference clock N3, as shown in FIG. 9, is H level on both sides of the falling edge A2 of the first reference clock N2.

This second reference clock N3 is supplied to a timing synchronization circuit 5. In the second embodiment, this timing synchronization circuit 5 is comprised of a D flip-flop circuit. That is, the second reference clock N3 is supplied to a D input terminal, and a timing signal N4 is supplied to a clock terminal. Then, a third reference clock N5 (CLK3), which matches the second reference clock N3 to the timing of the timing signal N4, is generated. In accordance with the operation of the D-type flip-flop, the inverted signal of the level of the second reference clock N3 supplied to the D input terminal at the rising edge of the timing signal N4 is outputted to inverted output/Q. Therefore, the third reference clock N5 is as depicted in FIG. 9.

Then, the third reference clock N5 is supplied via a dummy data output buffer 6 and a dummy input buffer 7 to the phase comparator as a variable clock N7, which comprises a fixed delay. Identical to the first embodiment, a delay control signal N9, which controls the delay time of the variable delay circuit 2, is generated by the phase comparator 8 and a phase controller 9 so as to match the phase of the falling edge A2 of the first reference clock N2 with the phase of the falling edge B2 of the variable clock N7.

As depicted by the broken lines in FIG. 9, if, hypothetically, it is assumed that the edge of the timing signal N4, which corresponds to edge B0, is B3, the third reference clock N5 is also generated in line with this as indicated by the broken lines, and the falling edge B4 of the variable clock N7 is controlled so that it matches up with edge A2, and the delay time of the variable delay circuit 2 is shortened. However, ordinarily, the falling edge B2 of the variable clock N7 undergoes a process wherein it shifts from left to right in FIG. 9, the DLL circuit enters a locked state and edge B2 matches up with edge A2.

In the second embodiment, the ½ phase shift circuit 40 generates the second reference clock N3 with a fixed-pulse-width before and after the falling edge A2 of the first reference clock N2. As described above, when DLL circuit operation commences, the delay controller 9 is reset, and sets the delay time of the variable delay circuit 2 to the minimum. Therefore, when the subsequent results of a phase comparison operation matches the phase of edge B2, which corresponds to the rising edge B0 of an internal clock, to the phase of edge A2 of the first reference clock, which corresponds to falling edge A1 after one clock cycle from edge B0 of the clock N1, the DLL circuit is set to a locked state. Accordingly, in the second embodiment, a third reference clock N5, which comprises a falling edge B1 that must be matched to edge A2 of the first reference clock N2, is generated from the second reference clock N3 and timing signal N4.

Therefore, the extent of the shift made by the ½ phase shift circuit 40 does not have to be that exact. Also, so long as the pulse width of the second reference clock N3 can be maintained on both sides of edge A2, it will not impede the operation of the DLL circuit.

In the second embodiment, the timing synchronization circuit 5 comprises a D-type flip-flop. By using a D-type flip-flop circuit, an inverted clock N5 that is in phase with the timing signal N4 can be readily generated. Moreover, a D-type flip-flop circuit is simpler than the circuit of a variable delay circuit 2. Therefore, even if a plurality of the circuitry 300 in the figure are equipped for a plurality of data output terminal, the scale of the circuitry will not increase that much.

Figure 10:
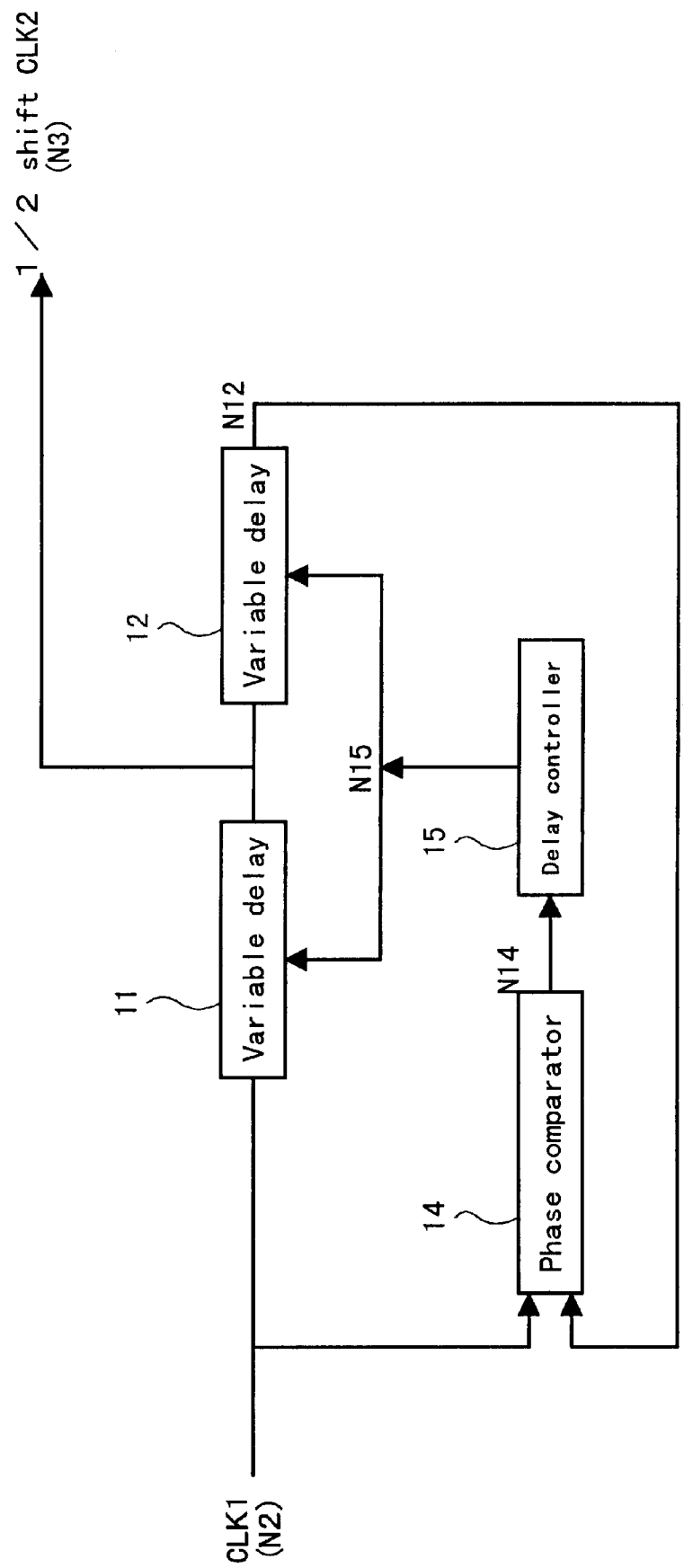
FIG. 10 depicts a circuit diagram of a ½ phase shift circuit 40.

FIG. 10 depicts a circuit diagram of a ½ phase shift circuit 40. The variable delay circuits 11, 12, the delay controller 15 and the phase comparator 14 are the same as the circuits illustrated in FIGS. 4, 5 and 6, respectively. This example of a ½ phase shift circuit 40 is comprised of a variable clock N12, which is fed back by using two variable delay circuits 11, 12 to delay a first reference clock N2 (CLK1), and a DLL circuit, which controls the variable clock N12 so that it is phase matched with the first reference clock N2 (CLK1). That is, similar to the DLL circuit depicted in FIG. 2, the phase comparator 14 compares the phase of the first reference clock N2 (CLK1) with that of the variable clock N12, and supplies an inspection signal N14 to the delay controller 15, and the delay controller 15 controls the delay times of the two variable delay circuits 11, 12 so that the two clocks are in phase with one another.

Moreover, the delay controllers 11, 12 have the same delay time, and, as illustrated in FIG. 5, DLL operation commences after the delay time has been set to the minimum by a reset signal. Therefore, the ½ shift clock N3 (CLK2), which is the output of variable delay circuit 11, is always a 180-degrees phase-shifted from the first reference clock N2 (CLK1).

Third Embodiment

Figure 11:
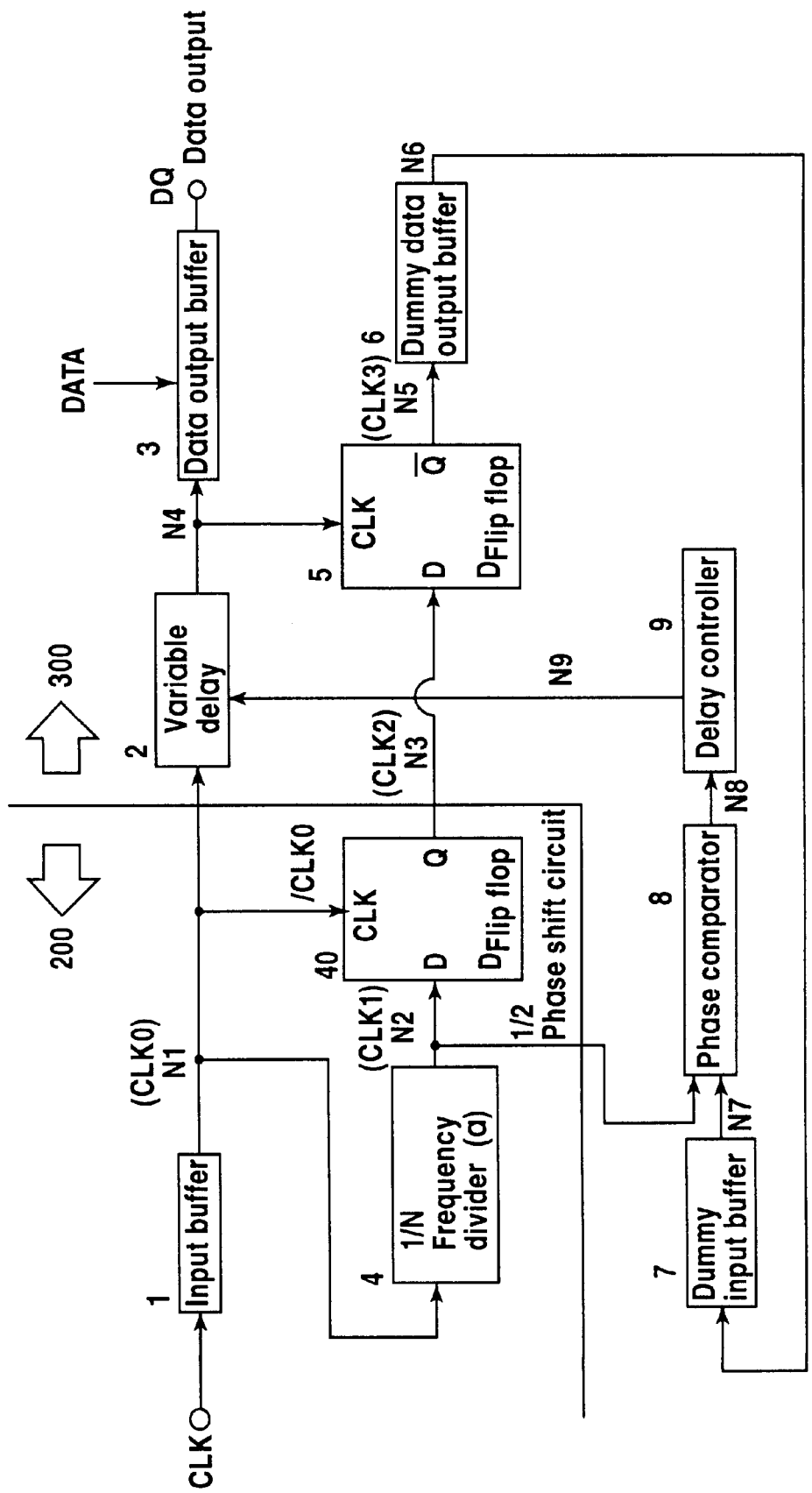
FIG. 11 is a diagram depicting a third embodiment.
Figure 12:
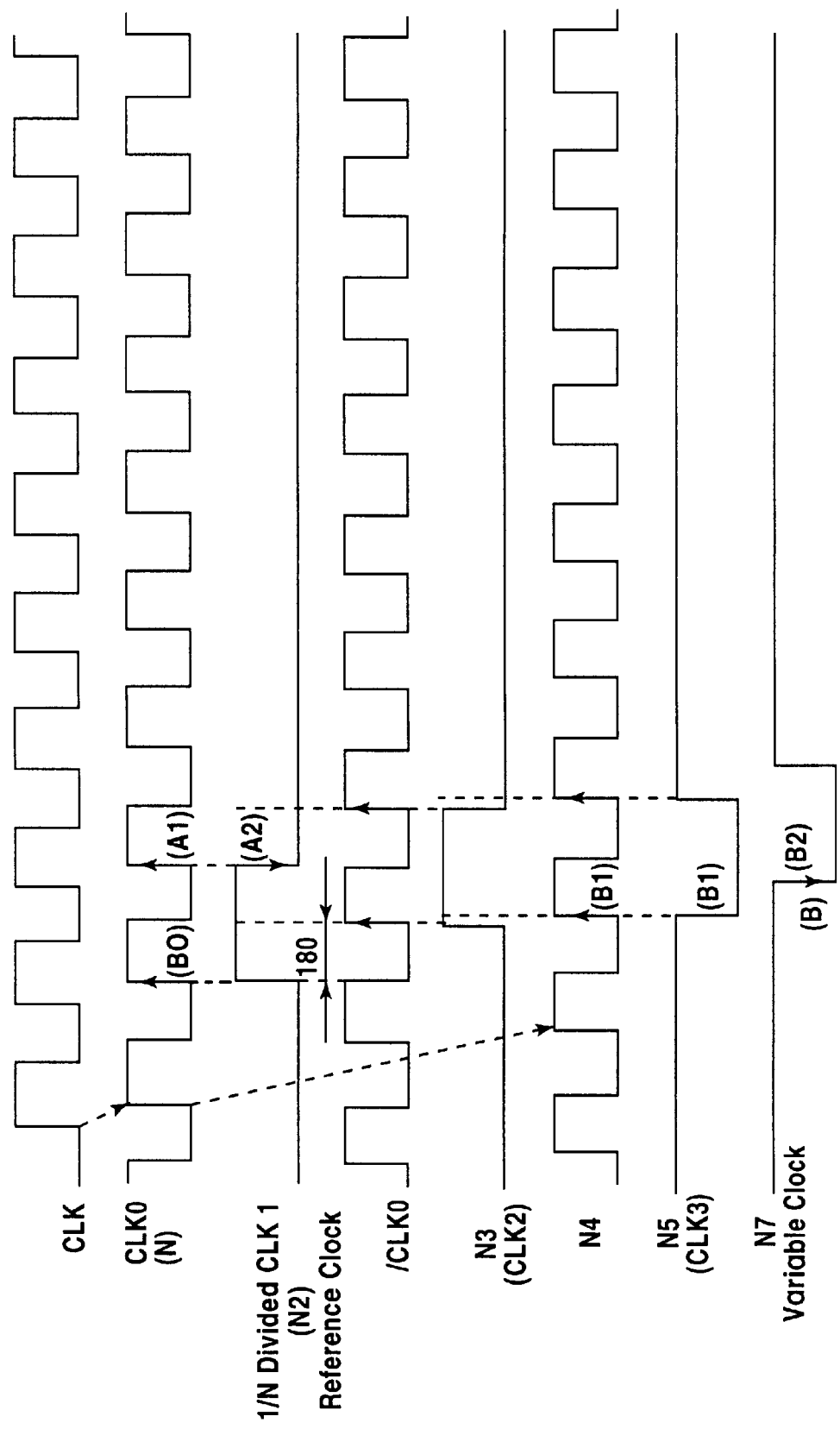
FIG. 12 is an operational timing chart for the circuitry depicted in FIG. 11.

FIG. 11 is a diagram depicting a third embodiment. And FIG. 12 is an operational timing chart for the circuitry depicted in FIG. 11. The third embodiment differs from the second embodiment illustrated in FIG. 8 in that the ½ phase shift circuit 40 comprises a D-type flip-flop circuit. Then, a first reference clock N2 (CLK1) is supplied to the D input terminal of the D-type flip-flop 40, and an inverted clock/CLK0 of an internal clock N1 is supplied to a clock input terminal CLK. Then, a second reference clock N3 (CLK2) is generated from a non-inverted output terminal Q. Other than that, the configuration is the same as the second embodiment.

As depicted in FIG. 12, the inverted clock/CLK0 of the internal clock N1 (CLK0) is 180 degrees phase delayed relative to the internal clock N1 (CLK0). Therefore, the D-type flip-flop can generate to the output Q a second reference clock N3 (CLK2), which is shifted 180 degrees from the first reference clock N2 (CLK1).

All other operations are identical to those of the second embodiment. Since the ½ phase shift circuit 40 is comprised of a D-type flip-flop, the third embodiment can be achieved with less circuitry than when the second embodiment used the DLL circuitry illustrated in FIG. 10.

As explained above, in accordance with the present invention, since a timing synchronization circuit is fabricated in place of a variable delay circuit in a self timing control circuit, which generates a timing signal using a DLL circuit, it is possible to reduce the number of large-scale variable delay circuits, and to make the overall scale of the circuit smaller.

Figure 13:
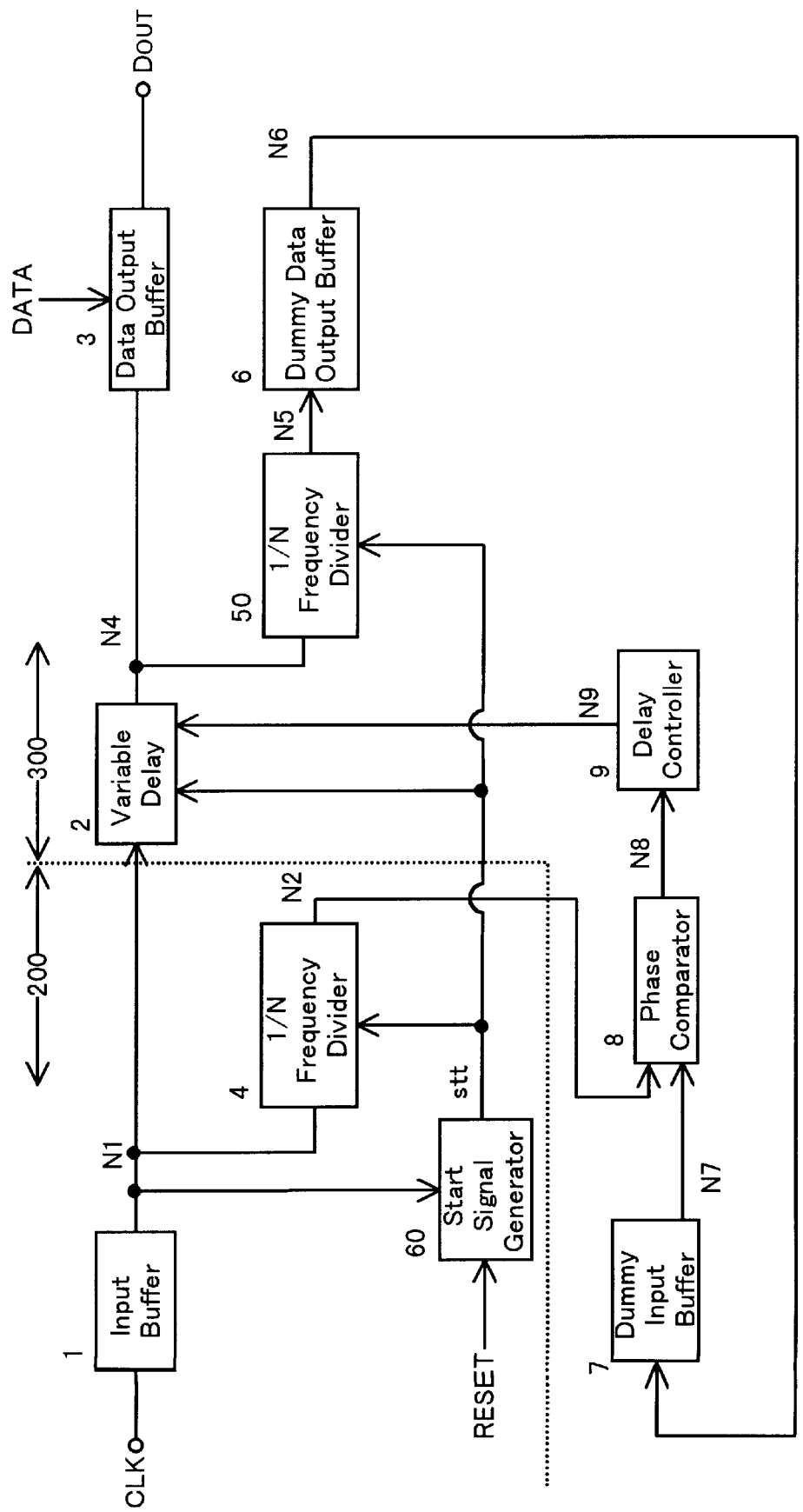
FIG. 13 shows a fourth embodiment of the present invention.

FIG. 13 shows a fourth embodiment of the present invention. For corresponding parts, FIG. 13 uses the same reference numbers that were used in FIG. 1. In FIG. 13, the variable delay circuit 10 shown in FIG. 1 has been eliminated, and in its place there is provided a second frequency divider 50 for dividing the frequency of a timing signal N4 output by a variable delay circuit 2. In addition, a start signal generation circuit 60 supplies a start signal stt to the first and second frequency dividers 4 and 50 as well as to a variable delay circuit 2 in response to a reset signal RESET. The supply of the start signal stt starts the respective frequency division operation and delay operation. The remainder of the arrangement is the same as the arrangement in FIG. 1.

An external clock CLK is supplied to an input buffer 1, and the input buffer 1 holds the external clock and generates an internal clock N1. Therefore, the internal clock N1 is a real clock that has the same frequency as the external clock. The variable delay circuit 2 delays the internal clock N1 for a specified time and generates a timing signal N4. In response to this timing signal N4, the data output buffer 3 outputs data DATA from memory, etc., as data output DQ. When used to hold an address or command, the timing signal N4 is supplied to an address or command input buffer, not shown in FIG. 13.

A first 1/N frequency divider 4 frequency divides the frequency of the internal clock N1 into 1/N and generates a first standard clock N2. The first standard clock N2 is supplied to a phase comparator 8 as a standard clock. Furthermore, the frequency of a high-frequency timing signal N4 generated by the variable delay circuit 2 is divided into 1/N by a second 1/N frequency divider 50, and a second standard clock N5 is generated. The second standard clock N5 passes through a dummy data output buffer 6 and a dummy input buffer 7, and is supplied as a variable clock N7 to the phase comparator 8. In this manner, this embodiment allows the variable delay circuit 2 to also be used as a variable delay circuit in the feed back loop of the DLL circuit. The phase comparator circuit 8 compares the phase of the first standard clock N2 that has been obtained from the division of the frequency of the internal clock, which is the variable delay circuit 2 input, and the phase of the variable clock N7, which has been obtained from the delay, in timing circuits 6 and 7, of the second standard clock N5 itself resulting from the division of the frequency of the timing signal N4, which is the variable delay circuit 2 output. As a result, the amount of delay of the frequency-divided clock N5 serving as the basis of the variable clock N7 becomes the same as the amount of delay of the timing signal N4 of the internal circuit 3, thus allowing the phase of the timing signal N4 to be more precisely controlled. This also makes it possible to reduce the number of variable delay circuits. The frequency-divided clocks N2 and N5 can be used in the DLL circuit, the power consumption of the phase comparison circuit 8 can be reduced, and the dummy circuits 6 and 7 can generate more precise delay times.

Figure 14:
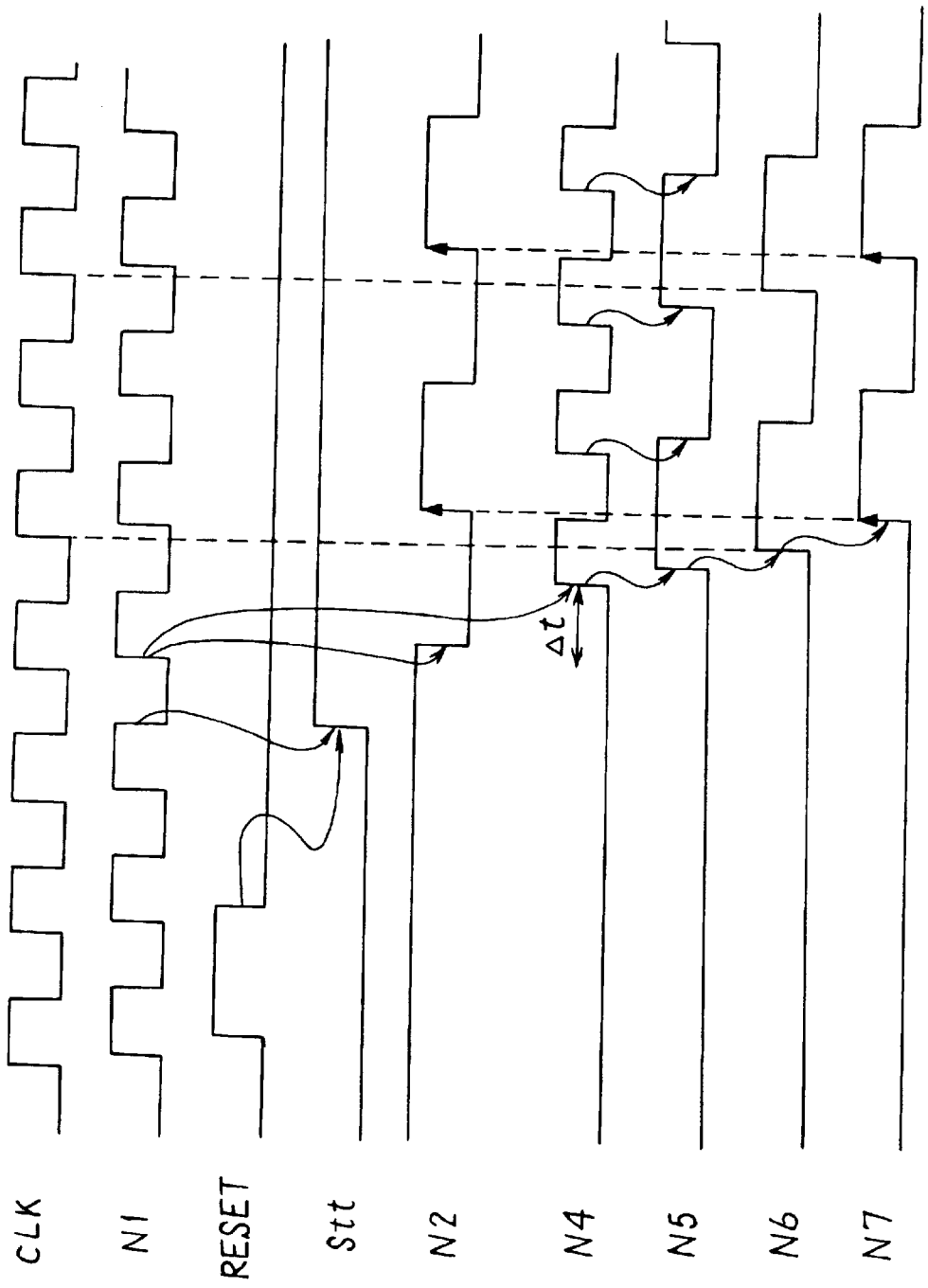
FIG. 14 is a timing chart showing the operation of the fourth embodiment of the present invention.

FIG. 14 is a timing chart that shows the operation of the fourth embodiment shown in FIG. 13. As stated above, the input buffer 1 holds the external clock CLK and generates an internal clock N1 having a fixed delay. Further, in the example in FIG. 14, the first frequency divider 4 frequency divides the frequency of the internal clock N1 in two, and generates the first standard clock N2. The second frequency divider 5 also divides the frequency of the timing signal N4 of the variable delay circuit 2 output in two, and generates the second standard clock N5. The first standard clock N2 and the second standard clock N5 are in phase opposite to each other relative to the input clock.

When a reset signal RESET consisting of an H level pulse is supplied to the start signal generator 10, the start signal stt is converted to H level in response to the trailing edge of the internal clock N1 after a fixed delay. In response to this start signal stt, the variable delay circuit 2 starts the delay of the internal clock N1, and the first and second frequency dividers 4 and 50 start frequency division operation. The first frequency divider 4 accordingly generates, from the internal clock N1, a reverse-phase first standard clock N2 having a frequency that has been divided in two. Furthermore, the variable delay circuit 2 delays the internal clock N1 for a specified time Δt and generates the timing signal N4. Then the second frequency divider 50 divides the frequency of the timing signal N4 and generates the second standard clock N5. As a result, as shown in FIG. 14, the second standard clock N5 is a clock in which the frequency-divided first standard clock N2 has been delayed by the delay amount Δt of the variable delay circuit 2.

The second standard clock N5 is supplied to the phase comparator 8 as the variable clock N7 after passing through the dummy data output buffer 6 and dummy input buffer 7. Then the phases of the leading edges of the first standard clock N2 and variable clock N7 are compared by the phase comparator 8, and a phase comparison determination signal N8 is supplied to a delay control circuit 9 in accordance with the phase difference. The delay control circuit 9 generates a delay control signal N9 in response to the phase comparison determination signal N9, so that the phases of both clocks are matched, and this is then supplied to the variable delay circuit 2. This DLL circuit feedback loop allows the leading edges (arrows in FIG. 14) of the first standard clock N2 and the variable clock N7 to be matched. As a result, the total delay time of the variable delay circuit 2, dummy data output buffer 6, and dummy input buffer 7 coincides with one cycle of the clock CLK, and in response to the timing signal N4, the phase of the internal data signal output Dout that is output by the data output buffer 3 is matched with the phase of the external clock CLK.

The above clock N2 divided by the first frequency divider 4 is developed into a reverse clock from the internal clock N1. This reverse clock can be generated by either the first frequency divider 4 or the second frequency divider 50. Alternatively, the reverse clock can be generated by the dummy data output buffer 6 or the dummy in put buffer 7 as long as the first standard clock and the variable clock are in opposite phase relative to the internal clock N1. Using the reverse clock in this manner allows DLL circuit phases to be more precisely controlled in the initial state.

In other words, in the initial state where a reset signal is generated, the number of variable delay stages for the variable delay circuit 2 is reset to the minimum value. Accordingly, the delay amount Δt of the timing signal N4 is reset to the minimum value. In this state, if the phase of the first standard clock N2 is not in reverse, there is a possibility that the delay control circuit 9 will generate a delay control signal N9 with a lower amount of delay, so that the leading edge of the variable clock N7 will match the initial leading edge of the first standard clock N2. In this event, the variable delay circuit 2 is not controlled to a delay shorter than the minimum delay amount, or a negative delay amount, so there are times when the DLL circuit cannot be correctly locked in. In this case, a reverse clock such as that shown in FIG. 14 allows the DLL circuit to be controlled in the direction in which the phase of the variable delay circuit clock N7 is actually delayed during the initial stage, and is precisely controlled so that the leading edges of the first standard clock N2 and the variable clock N7 shown by the arrows in the FIG. 14 are aligned.

In the example shown in FIG. 14, the first and second frequency dividers 4 and 50 divide frequencies in two, so that the leading edges of the reverse clocks N2 and N7 (arrows in FIG. 14) match the phase of the first cycle delay of the clock CLK.

As stated above, in the fourth embodiment, one variable delay circuit can be eliminated, and the size of the second frequency divider 50 circuit that is used as a substitute is much smaller, so there is no need to increase the size of the circuit even if a plurality of DLL circuits are provided. In other words, the circuit 200 portion in FIG. 2 can be provided for common use, and the circuit 300 portion can be provided for each data output DQ, but the circuit 300 portion is comparatively simpler than in conventional examples. In addition, because an internal clock of the same frequency as the external clock passes through the variable delay circuit 2, the timing signal N4 delay amount and the DLL circuit delay amount can be matched without relying on the clock frequency, which makes it possible to more precisely control the phase of the timing signal N4.

Next is shown an example of a detailed circuit of the start signal generator 60, frequency dividers 4 and 5, variable delay circuit 2, delay control circuit 9, and phase comparator 8 that constitute the circuit in FIG. 13.

Figure 15:
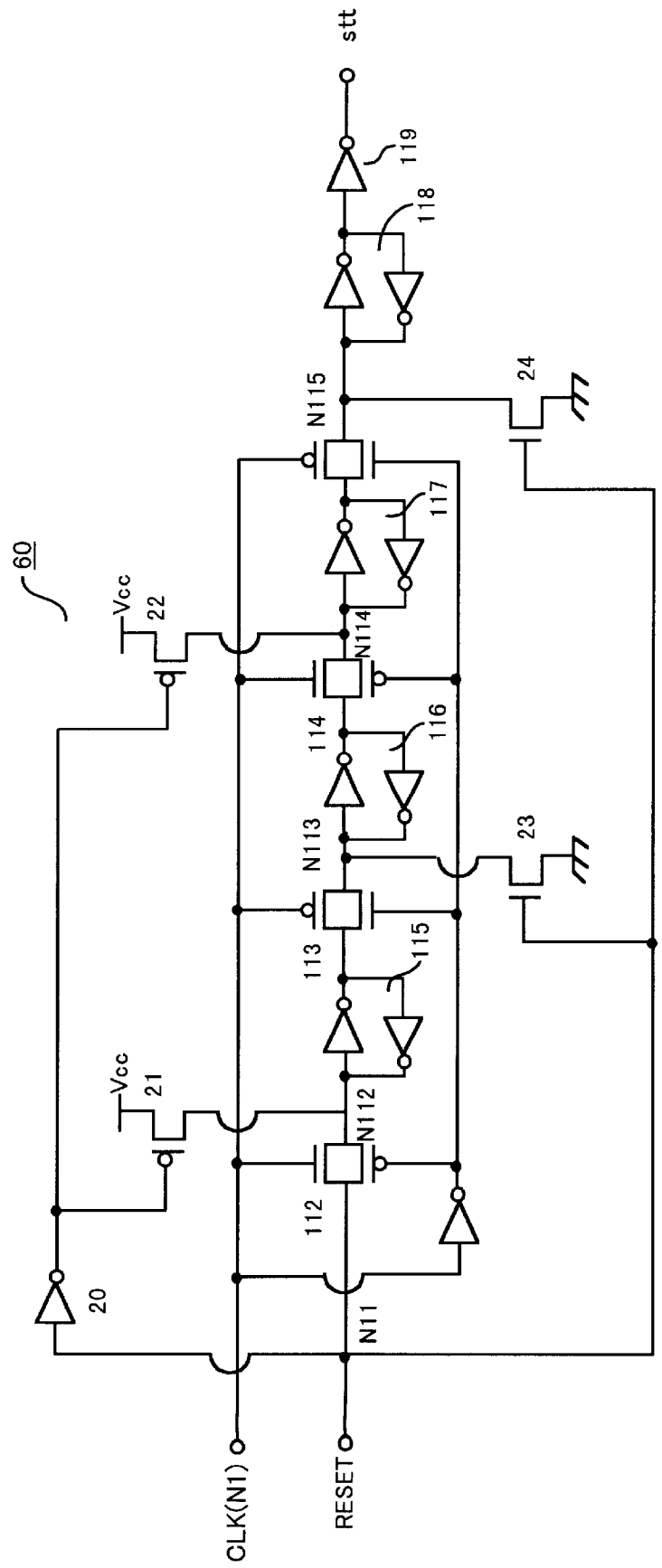
FIG. 15 is a start signal generator circuit diagram.

FIG. 15 illustrates an example of a start signal generator circuit. A start signal generator 60 comprises CMOS transistor transfer gates 112, 113, and 114, and latch circuits 115, 116, and 117 provided on the output side of the gates. When initially the reset signal RESET is converted to H level, an inverter 20, P channel transistors 21 and 22, and N channel transistors 23 and 24 reset nodes N12 and N14 to H level and nodes N13 and N15 to L level. Then, after the reset signal RESET changes to L level, a start signal stt rising from L level to H level is generated in response to the second trailing edge of the internal clock N1. The timing chart for this is as shown in FIG. 14.

Figure 16:
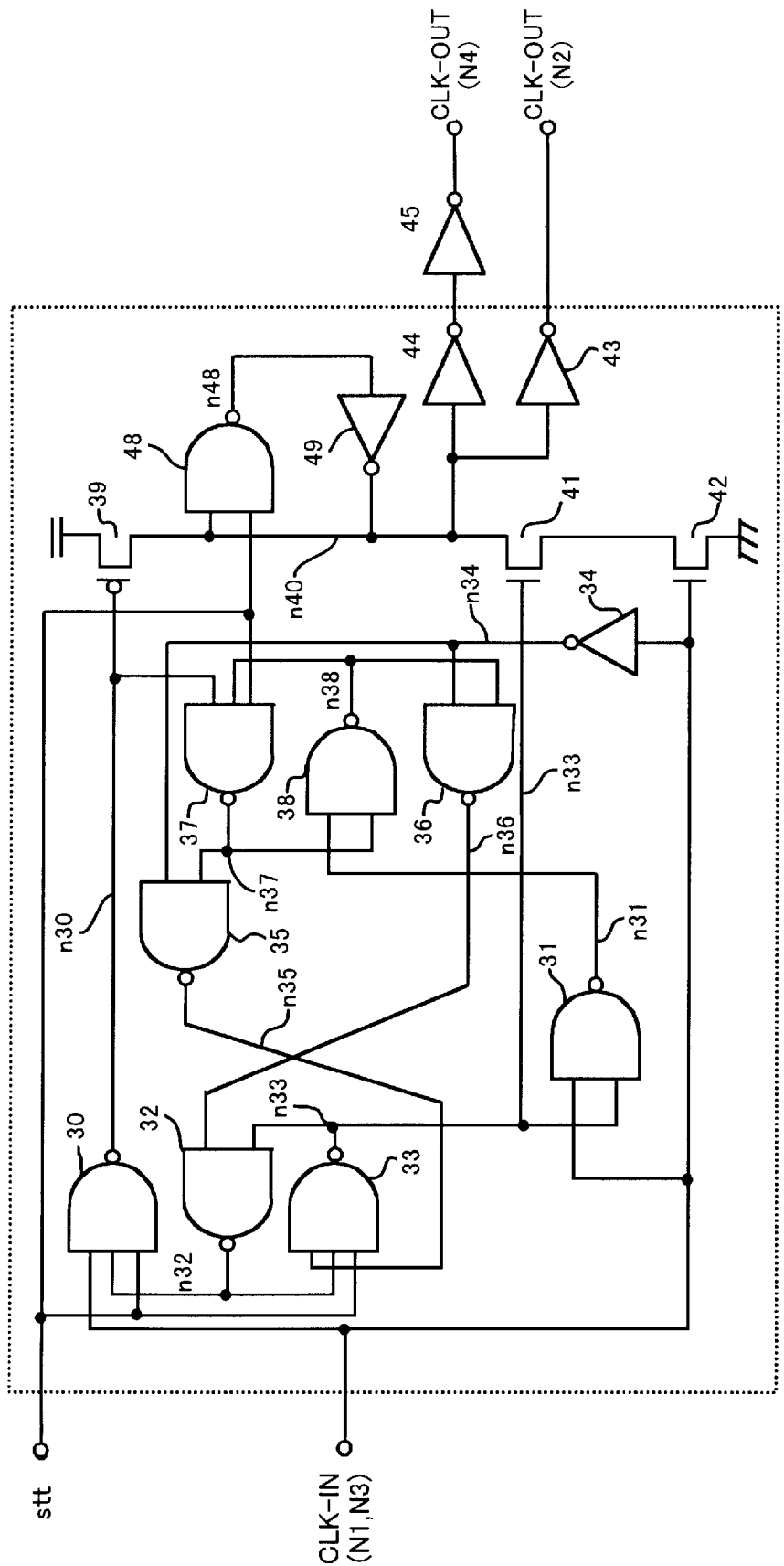
FIG. 16 is a first and second frequency divider circuit diagram.
Figure 17:
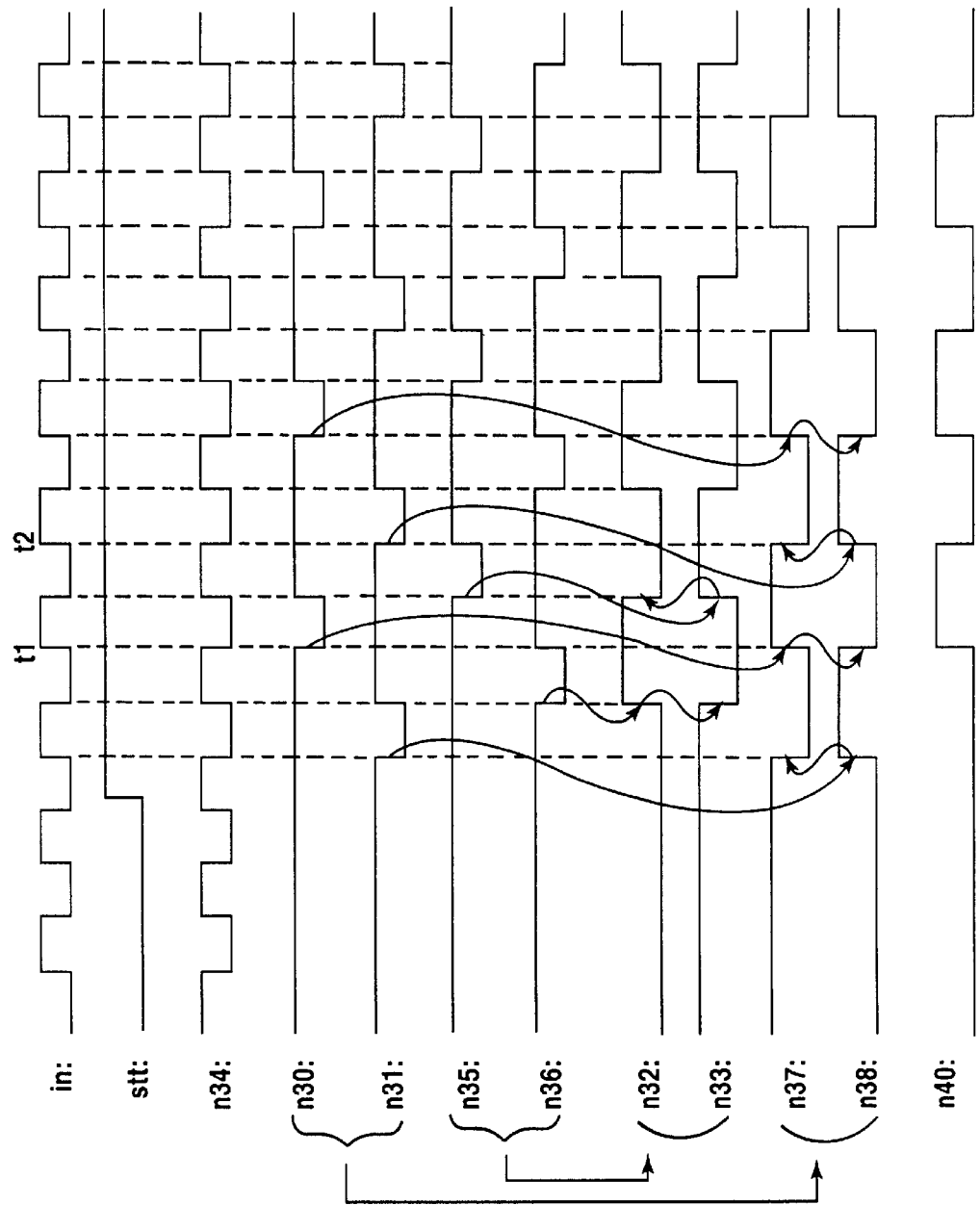
FIG. 17 is a timing chart for the operations in FIG. 16.

FIG. 16 is a circuit diagram of the first and second frequency dividers. Further, FIG. 17 is a timing chart of the operation of this circuit. This frequency divider configuration comprises NAND gates 37 and 38, which form the first latch circuit that is reversed at each second leading edge of the input clock CLK-IN; NAND gates 32 and 33, which form the second latch circuit that is reversed at each second trailing edge of the input clock CLK-IN; NAND gates 30 and 31 that transmit the second latch circuit status to the first latch circuit in response to the input clock CLK-IN; NAND gates 35 and 36 that transmit the first latch circuit status to the second latch circuit in response to the reverse clock n34 of the input clock CLK-IN; output stage transistors 39, 41, and 42; and gates 49 and 48, and output inverters 43, 44, and 45 which form the output stage latch circuits. The first frequency divider contains the output inverter 43, and the second frequency divider contains output inverters 44 and 45. FIG. 16 shows both the first and second frequency divider output inverters.

When the start signal stt changes to L level, the outputs n30, n33, n37, and n48 of gates 30, 33, 37, and 48 are forcibly set to H level, and an output stage node n40 is set to L level. Accordingly, the first frequency divider output N2 is reset to H level, and the second frequency divider output N4 is reset to L level. Furthermore, the first latch circuit node n37 is reset to H level, and the node n38 is reset to L level, while the second latch circuit node n33 is reset to H level, and the node n32 is reset to L level.

Then, when the start signal stt rises to H level, gates 30, 33, 37, and 48 become enabled, and the frequency divider begins frequency division operations. First, gates 30 and 31 alternately generate negative pulses in nodes n31 and n32 in response to the leading edge of the input clock CLK-IN. In the reset state, the node n33 is H level, so the node n31 generates the negative pulse first. In the same manner, gates 35 and 36 alternately generate a negative pulse in nodes n36 and n35 in response to the leading edge of the reverse clock n34 of the input clock. After the reset state, the node n38 is H level, so node n36 generates a negative pulse first.

In response to nodes n30 and n31, a clock with a frequency divided in half is generated in nodes n37 and n38 of the first latch. Additionally, in response to nodes n35 and n36, a clock with a frequency divided in half is generated in nodes n32 and n33 of the second latch. Then the transistor 39 is controlled by the node n30, the transistor 41 is controlled by the node n33, and the transistor 42 is controlled by the input clock CLK-IN. As a result, a clock obtained when the input clock CLK-IN is divided in half is generated in node n40, as shown in FIG. 17.

As stated above, the output stage inverter configurations for the first and second frequency dividers are different, so the divided clock phases are in phase opposite to each other. Furthermore, the frequency dividers do not divide frequencies while the start signal stt is L level, and are maintained in a reset state. So when the start stt changes to H level, the frequency of the input clock CLK-IN is divided in half.

Figure 18:
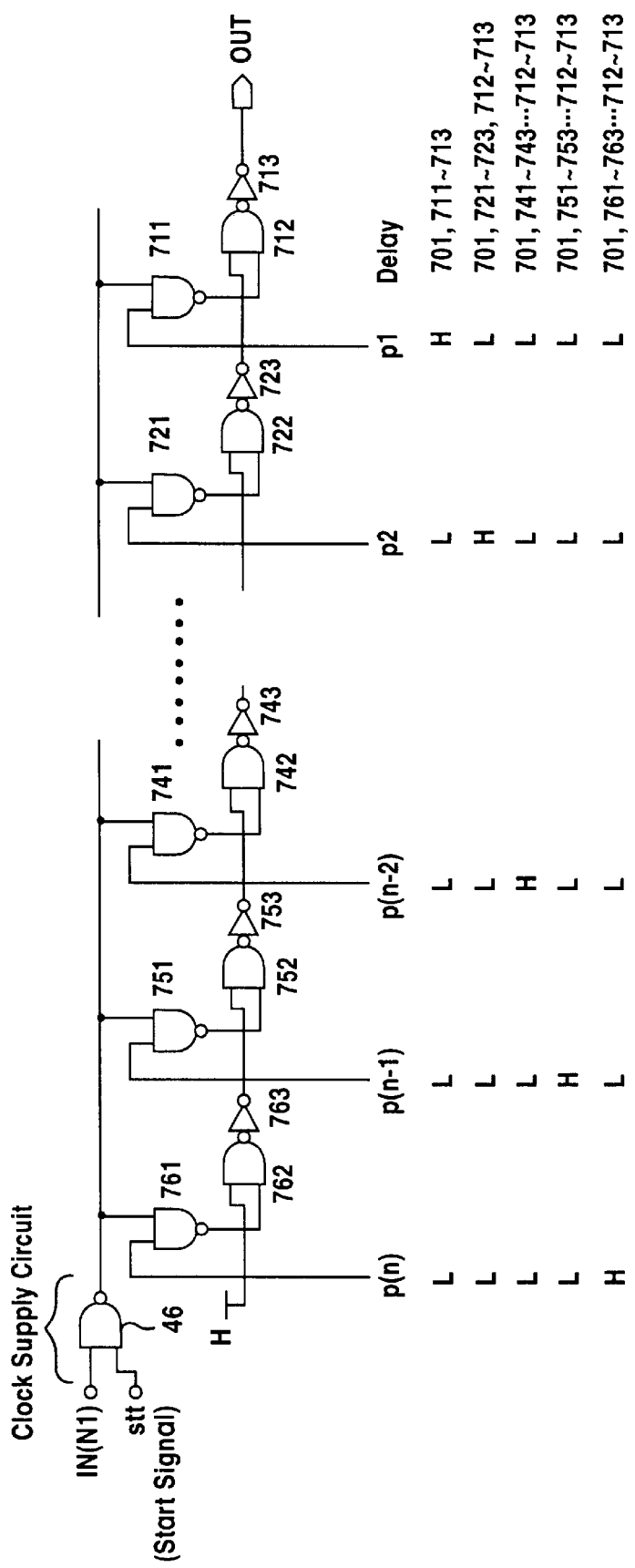
FIG. 18 is a circuit diagram showing an example of a variable delay circuit.

FIG. 18 is a circuit diagram showing an example of a variable delay circuit. The delay time of the variable delay circuit 2 is selected by means of delay control signals p1 to p(n) (N9 in FIG. 13). This variable delay circuit delays the clock N1 applied to the input terminal IN for a specified time and outputs the timing signal N4 to the output terminal OUT.

In this example, there are n stages of delay circuits, where the first stage comprises NAND 711 and 712, and an inverter 713; the second stage comprises NAND 721 and 722, and inverter 723; and so on, until the nth stage comprises NAND 761, 762, and 763.

A clock supply circuit 46 is provided in front of the first stage of the variable delay circuit 2. While the start signal stt is L level, the gate of the clock supply circuit 46 prevents the clock N1 from passing through, and when the start signal stt changes to H level, the clock N1 is supplied to the delay circuit side. Accordingly, the clock N1 is supplied to the variable delay circuit 2 in response to the rise of the start signal stt. At the reset state, the delay control signal p1 is H level so that the delay amount is set to be minimum of 4 gates. Another operation of the variable delay circuit 2 is the same as FIG. 4. Further, the delay control circuit 9 and the phase comparator 8 are the same as FIG. 5 and 6.

Figure 19:
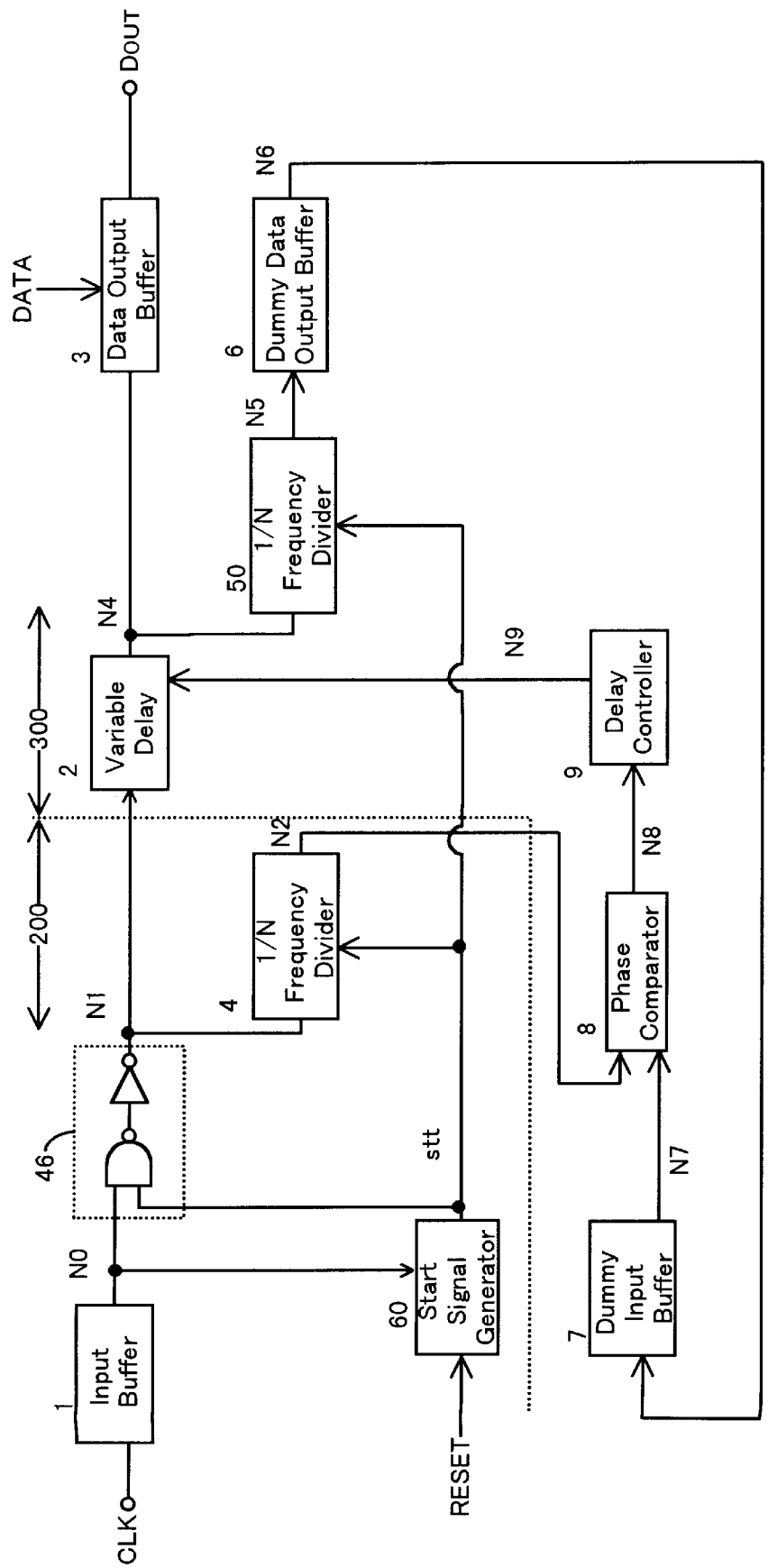
FIG. 19 is a circuit diagram for a fifth embodiment of the present invention.

FIG. 19 is a circuit diagram showing a fifth embodiment. The same reference numbers are used for the same parts as those used in the fourth embodiment in FIG. 13. First and second frequency dividers 4 and 50 are also provided in the fifth embodiment, and the frequency division is controlled by a start signal stt. However, the start signal stt is not supplied to a variable delay circuit 2; a clock supply circuit 46 is provided at a stage before the variable delay circuit 2 and first frequency divider 4. The start signal stt is supplied to the clock supply circuit 46, so while the start signal stt is L level, the supply of a clock N0 is stopped, and when the start signal stt is H level, the clock N0 is supplied to the variable delay circuit 2 and the first frequency divider 4 as an internal clock N1. This embodiment is otherwise the same as the first embodiment.

As is shown by FIG. 19, in the fifth embodiment, the clock input buffer 1, clock supply circuit 46, start signal generator 60, and first frequency divider 4 are provided in common for a plurality of buffers 3. In other words, circuit 200 is provided for joint use, and a circuit 300 is provided for each output buffer 3.

In accordance with the fifth embodiment, when the start signal stt rises from L level to H level in response to the H level pulse reset signal RESET, the clock N0 is supplied to the first frequency divider 4 and the variable delay circuit 2, the frequency division operations of the frequency dividers 4 and 50 are begun, and the phase of the timing signal N4 is controlled so that data output Dout that matches the phase of the external clock CLK can be output. Unlike a conventional DLL circuit, there is only one variable delay circuit, and the phase of the timing signal N4 can be precisely controlled, in both the second and first embodiments.

As explained above, according to the present invention, a variable delay circuit is used in common in the circuit that generates the timing signal using a DLL circuit, and the frequency of the output of this variable delay circuit is divided by a second frequency divider. Accordingly, the number of large-sized variable delay circuits can be reduced, making the overall size of the circuit smaller. Furthermore, the phases of the timing signal can be more precisely controlled. The DLL circuit can also be actuated by a frequency-divided clock.

What is claimed is:

1. An integrated circuit device, having an internal circuitry that operates at a predetermined phase related to a supplied clock, comprising:

a variable delay circuit, which generates a timing signal to said internal circuitry by delaying said supplied clock a predetermined time;

a frequency divider, which generates a first reference clock by dividing a frequency of said supplied clock;

a timing synchronization circuit, which generates a second reference clock by synchronizing said first reference clock with said timing signal; and a phase comparator and controller, which compares a phase of said first reference clock with that of a variable clock, which delays said second reference clock a predetermined time, and supplies a delay control signal to said variable delay circuit so as to phase match said variable clock with the first reference clock.

2. The integrated circuit device of claim 1, wherein:

said first reference clock has a pulse width of one cycle of said supplied clock;

said second reference clock has an inverted level of said first reference clock; and said phase comparator and controller controls the delay time of said variable delay circuit so that the timing of the rising or falling edge of said first reference clock matches the timing of the rising or falling edge of said variable clock.

3. The integrated circuit device of claims 1 or 2, wherein:

a plurality of sets of said variable delay circuit, said timing synchronization circuit and said phase comparator and controller are provided, said frequency divider is provided commonly for said plural sets.

4. An integrated circuit device, having an internal circuitry that operates at a predetermined phase related to a supplied clock, comprising:

a variable delay circuit, which generates a timing signal to said internal circuitry by delaying said supplied clock a predetermined time;

a frequency divider, which, by dividing a frequency of said clock, generates a first reference clock having a pulse width of one cycle of said supplied clock;

a phase shift circuit, which generates a second reference clock, which shifts a phase of said first reference clock by approximately ½ cycle;

a timing synchronization circuit, which generates a third reference clock by synchronizing said second reference clock with said timing signal; and a phase comparator and controller, which compares a phase of said first reference clock with that of a variable clock, which delays said third reference clock a predetermined time, and supplies a delay control signal to said variable delay circuit so as to phase match said variable clock with the first reference clock.

5. The integrated circuit of claim 4, wherein:

said timing synchronization circuit comprises a first D-type flip-flop circuit, having a D input terminal to which said second reference clock is input, a clock terminal to which said timing signal is input, and an output terminal from which said third reference clock is generated.

6. The integrated circuit of claim 4, wherein:

said phase shift circuit comprises a second D-type flip-flop circuit, having a D input terminal to which said first reference clock is input, a clock terminal to which an inverted clock of said supplied clock is input, and an output terminal from which said second reference clock is generated.

7. The integrated circuit device of any one of claims 4 through 6, wherein:

a plurality of sets of said variable delay circuit, said timing synchronization circuit and said phase comparator and controller are provided, said frequency divider and phase shift circuit are provided commonly for said plural sets.

8. An integrated circuit device having an internal circuit that is activated in response to a timing signal having a specified phase relationship with a clock, comprising:

a variable delay circuit for delaying said clock for a specified time and generating said timing signal for said internal circuit;

a first frequency divider for dividing a frequency of said clock and generating a first reference clock;

a second frequency divider for dividing the frequency of said timing signal and generating a second reference clock; and a phase comparison and control circuit for comparing a phase of a variable clock resulting from said second reference clock with that of said first reference clock, and for applying a delay control signal to said variable delay circuit so that the phases of both said first reference clock and said variable clock match.

9. The integrated circuit device according to claim 8, further comprising:

a start signal generation circuit for generating start signals that control the start of activation of said first and second frequency dividers.

10. The integrated circuit device according to claim 9, further comprising:

a clock supply circuit, provided at a stage before said variable delay circuit, for starting supply of said clock to said variable delay circuit in response to said start signal.

11. The integrated circuit device according to claim 9, further comprising:

a clock supply circuit, provided at a stage before said variable delay circuit and said first frequency divider, for starting supply of said clock to said variable delay circuit in response to said start signal.

12. The integrated circuit device according to claim 8, wherein:

said first frequency divider and said second frequency divider generate clocks that are in phase opposite to each other.

13. The integrated circuit device according to either claim 8 or 12, wherein:

a plurality of sets of said variable delay circuit, second frequency divider, and phase comparison and control circuit are provided in accordance with said internal circuit, said first frequency divider is provided commonly for said plural sets.

\* \* \* \* \*